US012677375B2

(12) United States Patent
Chang et al.

(10) Patent No.: US 12,677,375 B2
(45) Date of Patent: Jul. 7, 2026

(54) STEPPED PACKAGE AND RECESSED CIRCUIT BOARD

(71) Applicant: Intel Corporation, Santa Clara, CA (US)

(72) Inventors: Martin M. Chang, Beaverton, OR (US); Tin Poay Chuah, Bayan Baru (MY); Eng Huat Goh, Ayer Itam (MY); Chu Aun Lim, Hillsboro, OR (US); Min Suet Lim, Gelugor (MY)

(73) Assignee: Intel Corporation, Santa Clara, CA (US)

( * ) Notice: Subject to any disclaimer, the term of this patent is extended or adjusted under 35 U.S.C. 154(b) by 348 days.

(21) Appl. No.: 17/550,746

(22) Filed: Dec. 14, 2021

(65) Prior Publication Data

US 2022/0110214 A1 Apr. 7, 2022

(51) Int. Cl.
| *H05K 1/14* | (2006.01) |
| *H05K 1/02* | (2006.01) |
| *H05K 1/11* | (2006.01) |
| *H05K 1/183* | (2026.01) |
| *H05K 3/303* | (2026.01) |

(52) U.S. Cl.
CPC ........... *H05K 1/183* (2013.01); *H05K 1/0298* (2013.01); *H05K 1/113* (2013.01); *H05K 1/141* (2013.01);
(Continued)

(58) Field of Classification Search
CPC ...... H05K 1/183; H05K 1/0298; H05K 1/113; H05K 1/141; H05K 3/303; H05K 2201/09036; H05K 2201/09072; H05K 2201/10007; H05K 2201/10628; H05K 2201/10719; H05K 2201/10734; H05K 2203/041; H05K 3/3436; H05K 3/4697; H05K 2201/09845; H05K 2201/1053; H05K 1/02; H01L 25/105; H01L 2224/08225; H01L 2225/1023; H01L 2225/1058; H01L 2225/1082;
(Continued)

(56) References Cited

U.S. PATENT DOCUMENTS

| 7,863,735 B1 | 1/2011 | Cho et al. |
| 2004/0183186 A1* | 9/2004 | Hirose ................... H05K 1/183 |
| | | 257/E21.511 |

(Continued)

FOREIGN PATENT DOCUMENTS

| EP | 0898311 A2 | 2/1999 |
| JP | 2008047771 A | 2/2008 |

OTHER PUBLICATIONS

English Translation EP0898311; NEC Corp, Imai et al; Published May 17, 2000 (Year: 2000).*
(Continued)

*Primary Examiner* — Steven T Sawyer
(74) *Attorney, Agent, or Firm* — Alliance IP, LLC

(57) ABSTRACT

An apparatus comprising a package comprising a first side to interface with at least one chip; and a second side to interface with a circuit board, the second side opposite to the first side, wherein the second side comprises a non-stepped portion comprising a first plurality of conductive contacts; and a stepped portion that protrudes from the non-stepped portion, the stepped portion comprising a second plurality of conductive contacts.

16 Claims, 12 Drawing Sheets

(52) U.S. Cl.
  CPC ... *H05K 3/303* (2013.01); *H05K 2201/09036* (2013.01); *H05K 2201/09072* (2013.01); *H05K 2201/10007* (2013.01); *H05K 2201/10628* (2013.01); *H05K 2201/10719* (2013.01); *H05K 2201/10734* (2013.01); *H05K 2203/041* (2013.01)

(58) Field of Classification Search
  CPC . H01L 2924/15159; H01L 2924/15311; H01L 21/4857; H01L 23/49822; H01L 2924/30107; H01L 2924/3011; H01L 23/13; H01L 23/49816; H01L 23/49833; H01L 23/31; H01L 21/56; H01L 24/14; H01L 2224/1403
  See application file for complete search history.

(56) References Cited

U.S. PATENT DOCUMENTS

| | | | |
|---|---|---|---|
| 2006/0097370 A1 | 5/2006 | Bartley et al. | |
| 2010/0127402 A1 | 5/2010 | Grundy et al. | |
| 2018/0270957 A1* | 9/2018 | Swaminathan et al. | |
| 2019/0037683 A1* | 1/2019 | Han | G06F 1/1658 |
| 2021/0183779 A1* | 6/2021 | Cheah | H01L 21/50 |
| 2021/0280490 A1 | 9/2021 | Gavagnin et al. | |

OTHER PUBLICATIONS

EPO; Extended European Search Report issued in EP Patent Application No. 22206060.0, dated May 15, 2023; 9 pages.

* cited by examiner

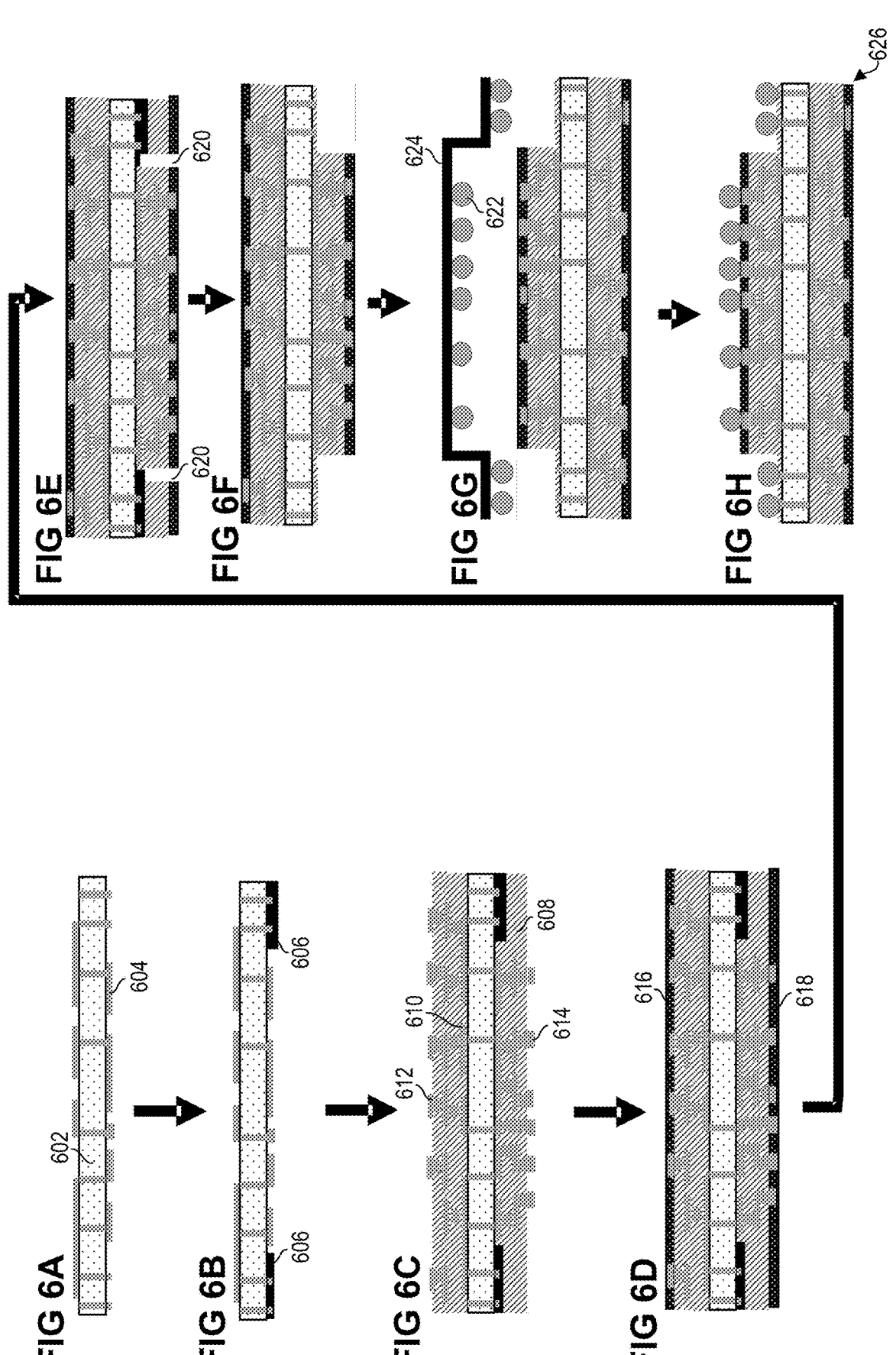

FIG 7A
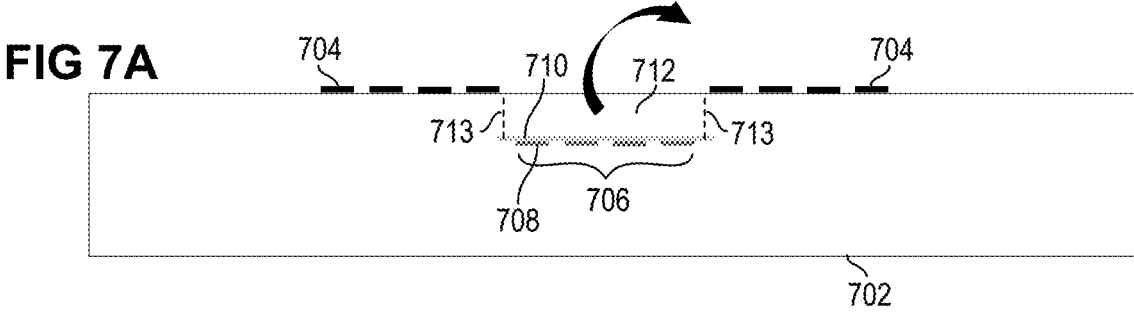
FIG 7B
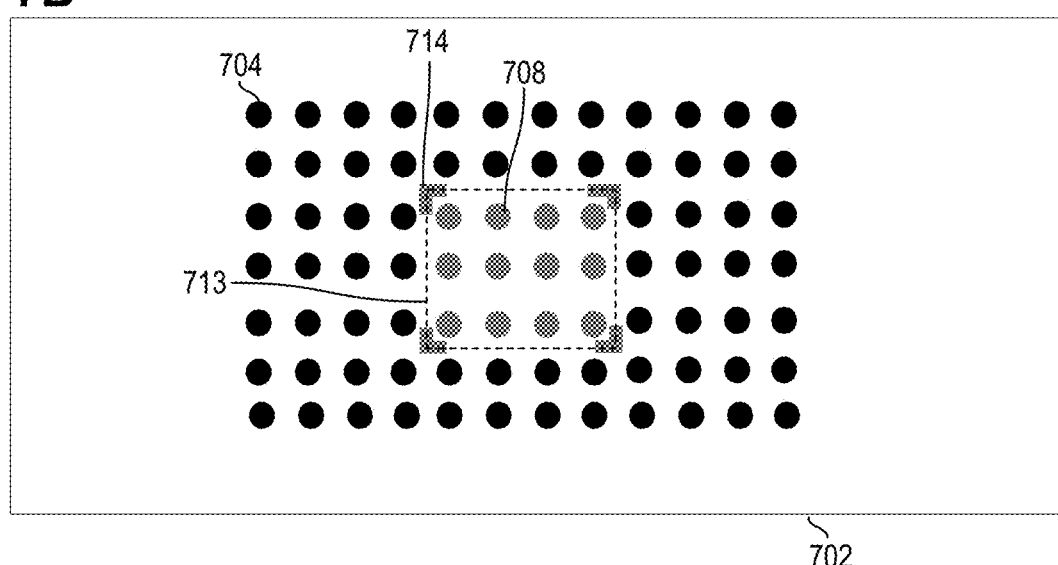
FIG 7C
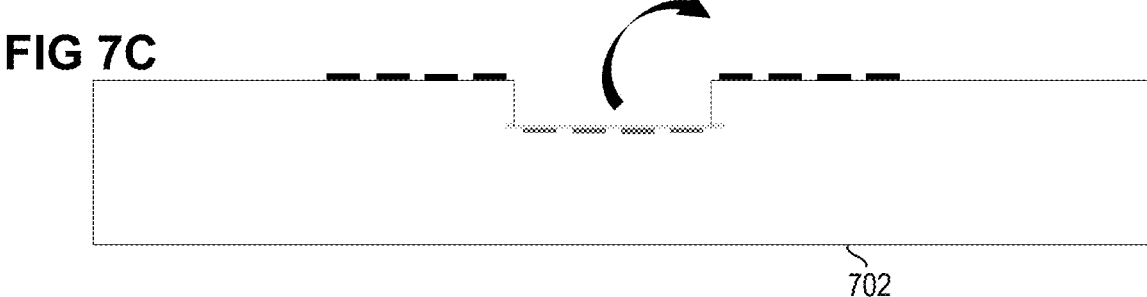

STEPPED PACKAGE AND RECESSED CIRCUIT BOARD

BACKGROUND

A package may comprise one or more chips. The package may interface with a circuit board that includes a plurality of conductive layers to route signals between the one or more chips and one or more other components coupled to the circuit board.

BRIEF DESCRIPTION OF THE DRAWINGS

FIGS. 6A-6H illustrate a flow for forming a stepped package in accordance with certain embodiments.

FIGS. 7A-7G illustrates a flow for forming a recessed board in accordance with certain embodiments.

Like reference numbers and designations in the various drawings indicate like elements.

DETAILED DESCRIPTION

Figure 1A:
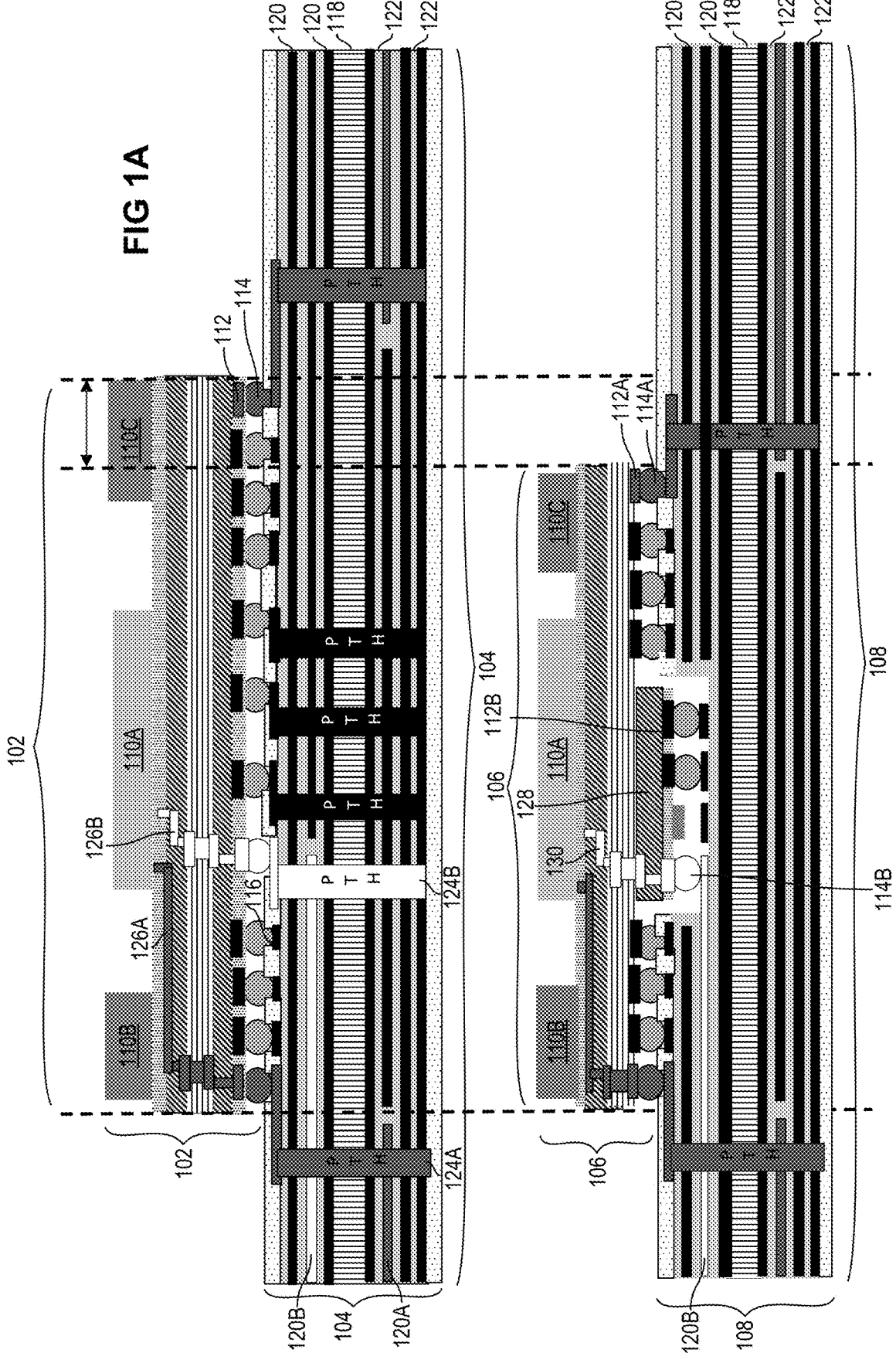
FIGS. 1A-1C illustrate cross section and top views comparing a package and circuit board with a stepped package and recessed circuit board in accordance with certain embodiments.
Figure 1B:
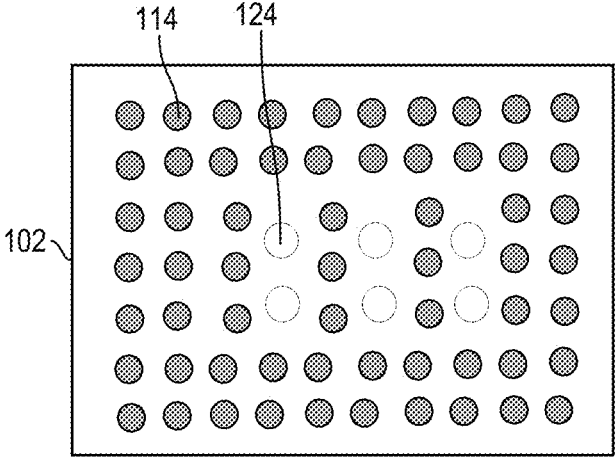
Figure 1C:
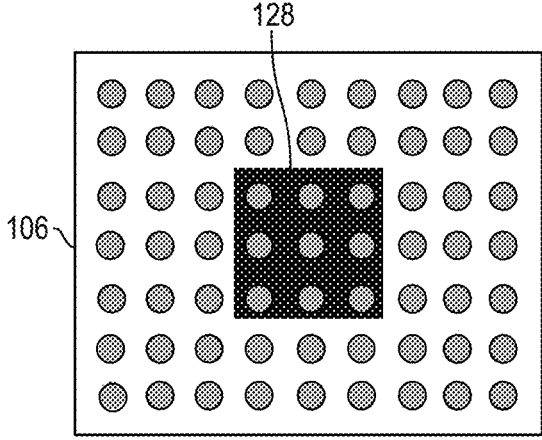

FIGS. 1A-1C illustrate cross section and top views comparing a package 102 and circuit board 104 to a stepped package 106 and recessed circuit board 108 in accordance with certain embodiments. One side of the package 102 may interface with one or more chips 110 (e.g., 110A, 110B, and 110C). For example, the top side of the package may include conductive contacts (e.g., solder pads) that couple to conductive contacts of the chips 110 (e.g., via a solder connection). Another side of the package 102 that is opposite to the first side may interface with the circuit board 104. For example, the bottom side of the package 102 may include a plurality of conductive contacts 112 (e.g., solder pads). Solder balls 114 may be formed on the conductive contacts 112 and used to couple the conductive contacts 112 of the package 102 to corresponding conductive contacts 116 of the circuit board 104. A conductive contact may comprise any suitable conductive material (e.g., copper) arranged in any suitable shape.

The circuit board 104 includes a core layer 118 and a plurality of alternating conductive layers 120 and insulating layers 122, where a conductive layer 120 may have any number of different (e.g., electrically isolated) interconnects on the same plane of the circuit board 104. The circuit board 104 also includes a plurality of plated through hole (PTH) vias 124. A PTH via 124 (e.g., 124A, 124B) may comprise a hole that goes through the circuit board 104 and has its walls plated with a conductive material (e.g., copper). A PTH via 124 may provide a conductive path from an interconnect of one conductive layer 120 of the circuit board 104 to an interconnect of another conductive layer 120. For example, in the embodiment depicted, a first conductive contact of the chip 110A may be coupled through an interconnect 126A of the package 102 to a conductive contact on the opposite side of the package, through a solder ball, onto an interconnect of a first conductive layer of the circuit board 104, through PTH via 124A, to an interconnect of a sixth conductive layer 120A of the circuit board. As another example, in the embodiment depicted, a second conductive contact of the chip 110A may be coupled through an interconnect 126B of the package 102 to a conductive contact on the opposite side of the package, through a solder ball, onto an interconnect of the first conductive layer of the circuit board 104, through PTH via 124B, to an interconnect of the third conductive layer 120B of the circuit board.

Although the PTH vias 124 provide connectivity, a high frequency input/output signal that is routed through a PTH via 124 may be negatively affected by reflections due to the excess length of the signal path through the PTH via stub (as the PTH via may go through all layers of the circuit board, rather than from one conductive layer to the target conductive layer). For example, the signal that is routed through PTH via 124B to layer 3 may suffer from noise reflections due to the PTH via extending all the way down the circuit board past layer 7. While this issue may be alleviated by using laser drilled vias from one layer to a target layer (e.g., as may be done on a type 4 printed circuit board (PCB)), such implementations may be more expensive than a circuit board that utilizes PTH via connectivity (e.g., in a type 3 PCB).

Certain higher speed I/O signals (e.g., 40G Thunderbolt, PCIE Gen5, LP5 6400 MT/s, etc.) may not be able to be routed through a PTH via stub due to signal quality issues. Thus, such signals may need to use the top or bottom conductive layer of the circuit board. However, such a constraint may create signal integrity and electromagnetic compatibility (EMC)\electromagnetic interference (EMI) issues. For example, the top layer of the circuit board may be consumed entirely by component breakout, making it difficult to route the entire bus cleanly. As another example, top and bottom conductive layers of a circuit board may utilize microstrip routing, which may not be ideal for high-speed routes (e.g., due to having only one reference plane), which then results in the creation of excessive crosstalk. Further, signals routed on the top or bottom conductive layers may require wider traces and larger trace-to-trace separation than internal stripline layers to meet the same impedance targets and have suitable crosstalk coupling. Routing on top and bottom layers may create more EMC\EMI problems due to the lack of a power\GND layer to shield the signal traces (and this problem worsens as signal frequencies continue to advance higher). Finally, signals routed on upper conductive layers will have longer PTH via stubs that create big discontinuities, which then produce reflections on the bus resulting in degraded signal quality.

Various embodiments of the present disclosure provide a stepped package 106 with surfaces at multiple different heights on a side of the package (e.g., the bottom side in the embodiment depicted). Thus, different groups of conductive contacts 112 and/or solder balls 114 of the package at such surfaces may be at multiple different heights. For example, stepped package 106 includes conductive contacts 112A and solder balls 114A on a first portion of the bottom side at respective first heights as well as conductive contacts 112B and solder balls 114B on a second portion of the bottom side at respective second heights. The conductive contacts 112B and solder balls 114B are on a stepped portion 128 of the stepped package that protrudes from the rest of the bottom portion of the package. In various embodiments, the solder balls may collectively form a ball grid array (BGA) at multiple package heights. In some embodiments, the stepped down portion 128 may be located at or proximate the center of the package. Thus, a ring recess may be formed around the stepped portion 128 along the package bottom periph-erals creating multiple heights on the package's bottom surfaces. In other embodiments, the stepped down portion 128 may be located at any suitable portion of the package (e.g., proximate one or more sides of the package, some-where on the package away from the center of the package, etc.). Although various embodiments herein depict the stepped down portions as being square in shape, a stepped down portion may have any suitable shape (e.g., rectangular, other polygon, etc.).

A recessed area is formed in the circuit board 108 that matches the height profile of the package 106. The solder balls may be of multiple ball heights and/or diameters to match the package recess height and circuit board recess depth. The package may be mounted onto the circuit board 108 during a surface mount process.

The stepped portion 128 and the solder balls 114B placed thereon may be placed into the recessed portion of the circuit board 108 and contact an internal circuit board layer (e.g., an interconnect of a conductive layer that is in between the top and bottom conductive layers of the circuit board). For example, in the embodiment depicted, the solder ball 114B coupled to interconnect 130 connects to the third conductive layer 120B. In this manner, I/O signals broken out from the footprint of the package 106 to the internal layer of the circuit board 108 may avoid using PTH vias, thus improving the integrity of the signals and enabling higher speeds. In some embodiments, one or more additional tiers of steps may be built on the package 106 to allow connection to other internal layers of the circuit board 108 for additional stubless routing.

As depicted in FIG. 1A, the footprint of the stepped package 106 may be reduced (e.g., relative to a standard package having the same number of pins). This is further illustrated in FIGS. 1B and 1C. The package footprint for an example package 102 is shown in FIG. 1B. In this footprint, allowance is made for PTH vias 124. For example, a package footprint to interface with a Type 3 circuit board generally has an outer row ball pattern with higher I/O density breaking out on the surface layer of the circuit board due to not using PTH vias for such signals, whereas the inner row ball pattern is routed on internal signal layers, which use PTH vias 124 that then force a larger via spacing. The package footprint for an example stepped package 106 is shown in FIG. 1C. As depicted, no allowance is made for the PTH vias 124 on the stepped portion 128 and thus the solder balls 114 may be placed closer together, reducing the foot-print.

Various embodiments of the present disclosure may pro-vide one or more technical advantages. For example, a stepped package and recessed board may enable better high speed I/O signal integrity through elimination of at least some of the PTH via stubs. Some embodiments enable I/O speeds on a Type 3 PCB that match or approach the I/O speeds available on a much costlier Type 4 PCB. As another example, the footprint of the package may be reduced (e.g., through elimination of PTH via placement into inner row ball patterns). As another example, the impedance of a platform or system may be reduced through a stepped package placed into a circuit board cavity. This may also reduce total system height for a thinner, sleeker form factor. As another example, cost savings may be realized through use of a lower priced circuit board. As another example, power delivery may be improved through a shorter path (resulting in reduced inductance loop).

Figure 2:
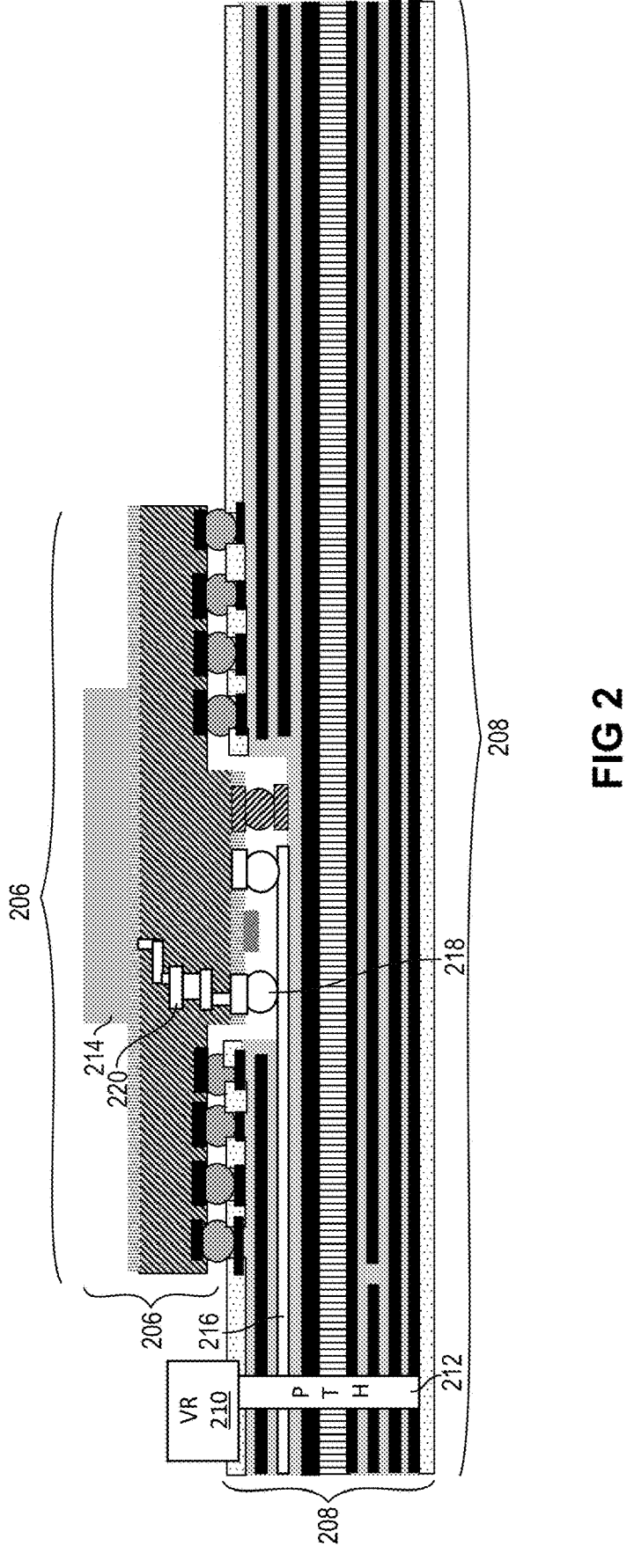
FIG. 2 illustrates a cross section of a stepped package and recessed circuit board in accordance with certain embodiments.

FIG. 2 illustrates a cross section of a stepped package 206 and recessed circuit board 208 in accordance with certain embodiments. The package 206 and circuit board 208 may have any suitable characteristics of other packages and circuit boards described herein (e.g., 106, 108).

In this embodiment, a voltage regulator 210 is coupled to a PTH via 212 of the circuit board 208. The power signal from the voltage regulator 210 is coupled to the chip 214 through an interconnect of a third conductive layer 216 of the circuit board, solder ball 218 on a stepped portion of the package 206, and interconnect 220 of the package 206. In some embodiments, when a stepped package is used, any PTH vias (e.g., 212) may be located away from the portion (e.g., middle) of the circuit board 208 that interfaces with the stepped portion (e.g., PTH via 212 is shown near one end of the circuit board 208). Package solder balls 218 may be recessed to inner conductive layers (e.g., level three in the embodiment shown) for a shorter inductance loop. The elimination of PTH vias at the recessed circuit board region may reduce a "swiss-cheese" effect on the power planes that would result from having multiple holes punched through the power planes to form PTH vias, thus improving the power delivery network.

Figure 3:
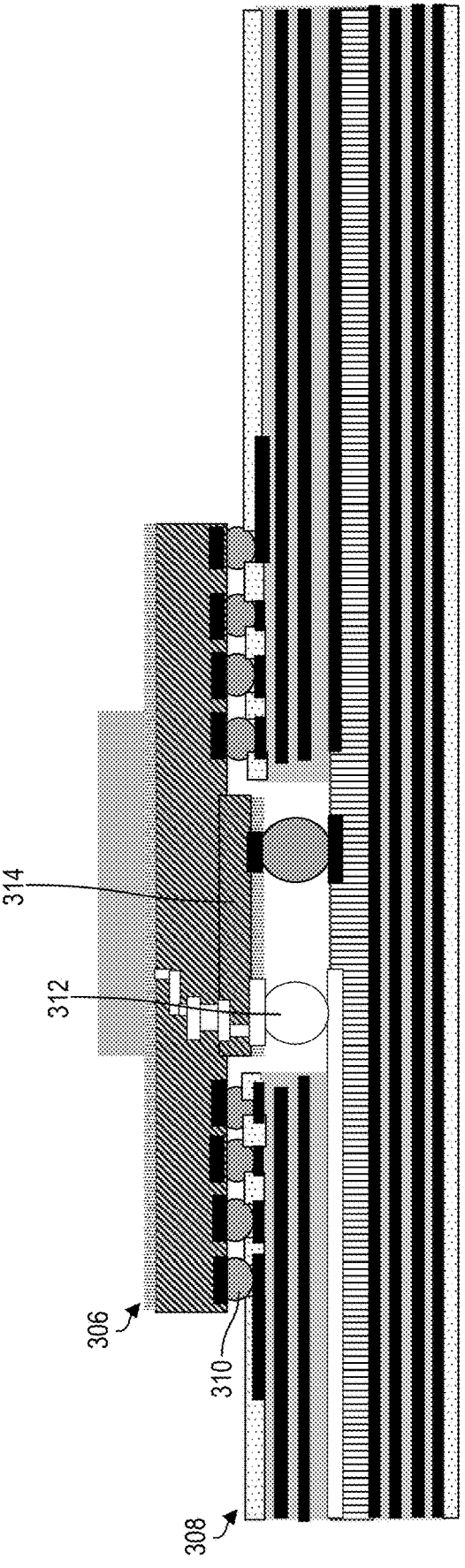
FIG. 3 illustrates a cross section of a stepped package and recessed circuit board with multiple solder ball sizes in accordance with certain embodiments.

FIG. 3 illustrates a cross section of a stepped package 306 and circuit board 308 in accordance with certain embodi-ments. The package 306 and circuit board 308 may have any suitable characteristics of other packages and circuit boards described herein (e.g., 106, 206, 108, 208). In this embodi-ment, the solder balls 310 that are coupled to the non-stepped portion of the package 306 have a first size (e.g., diameter, height, or other dimension) that is smaller than a second size of the solder balls 312 that are coupled to the stepped portion 314 of the package 306. The difference in sizes of the solder balls 310 and 312 may refer to either the sizes of the solder balls 310 and 312 before they are reflowed or after they are reflowed to form the connections between the package 306 and the circuit board 308. In various embodiments, the height of a solder ball 312 (or at least a subset of the solder balls 312) may be materially larger than the height of a solder ball 310 (e.g., at least 5% larger, at least 10% larger, at least 20% larger, etc.) where "materially larger" is meant to convey a size difference that is larger than a size difference among solder balls that occurs naturally due to process variations despite the solder balls being designed to be the same size. This difference in dimensions of the solder balls 310 and 312 may facilitate alignment of the height of the recessed portion of the circuit board 308 and the stepped height of the package 306 for I/O breakout at different circuit board layers. In a similar fashion, the pitch between two adjacent solder balls 310 of the non-stepped portion may be different from the pitch between two adja-cent solder balls 312 on the stepped portion.

Figure 4:
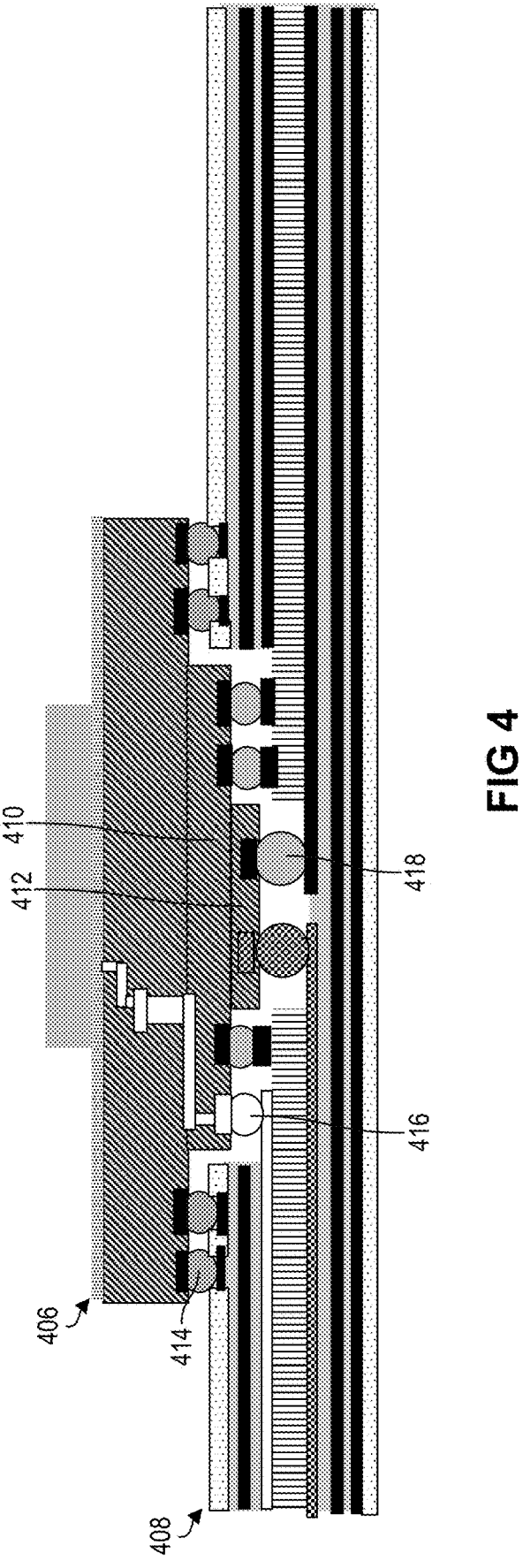
FIG. 4 illustrates a cross section of a multi-tier stepped package and multi-tier recessed circuit board in accordance with certain embodiments.

FIG. 4 illustrates a cross section of a multi-tier stepped package 406 and circuit board 408 in accordance with certain embodiments. The package 406 and circuit board 408 may have any suitable characteristics of other packages and circuit boards described herein (e.g., 106, 206, 306, 108, 208, 308). The package 406 includes multiple stepped portions 410 and 412 that each have different heights. The circuit board 408 includes corresponding recessed portions of different heights that each interface at different internal conductive layers of the circuit board. In some embodiments, the multi-tier stepped package 406 and multi-tier recessed circuit board may enable all I/O signals and power signals of the package 406 to be routed to the desired circuit board layers without utilizing PTH vias (e.g., in Type 3 PCBs). Although a 2-tier stepped package is depicted, in other embodiments, any suitable number of tiered steps of the package.

In some embodiments, the first stepped portion 410 may be entirely surrounded by the non-stepped portion (e.g., similar to how the stepped portion 128 is surrounded by the non-stepped portion as shown in FIG. 1C) and the second stepped portion 412 may be entirely surrounded by the first stepped portion 410. Thus, the stepped portions are concentric, such that the stepped portion 412 that protrudes furthest from the package 406 is surrounded by the next stepped portion 410, which itself is surrounded by the non-stepped portion of the package bottom. In other embodiments, a stepped portion may only be partially surrounded by the non-stepped portion or another stepped portion (e.g., second stepped portion 412 may have one or more sides that are continuous with a side of the stepped portion 410 rather than being located in the center of the stepped portion 410 or may otherwise have a center that is offset from the center of the stepped portion 410).

The size of the solder balls attached to the package 406 may be the same or may vary by layer. In various embodiments, two or more different stepped portions may have the same size solder balls and/or different stepped portions may each have solder balls of differing sizes. For example, the solder balls 414 on the non-stepped portion of the package may be the same size as solder balls 416 on the first stepped portion 410 and solder balls 418 on the second stepped portion 412. Alternatively, the solder balls 414 may be smaller than solder balls 416 and/or solder balls 418. In one embodiment, solder balls 418 are the largest solder balls, solder balls 414 are the smallest solder balls, and solder balls 416 have a size that is in between the sizes of solder balls 414 and 418.

Figure 5:
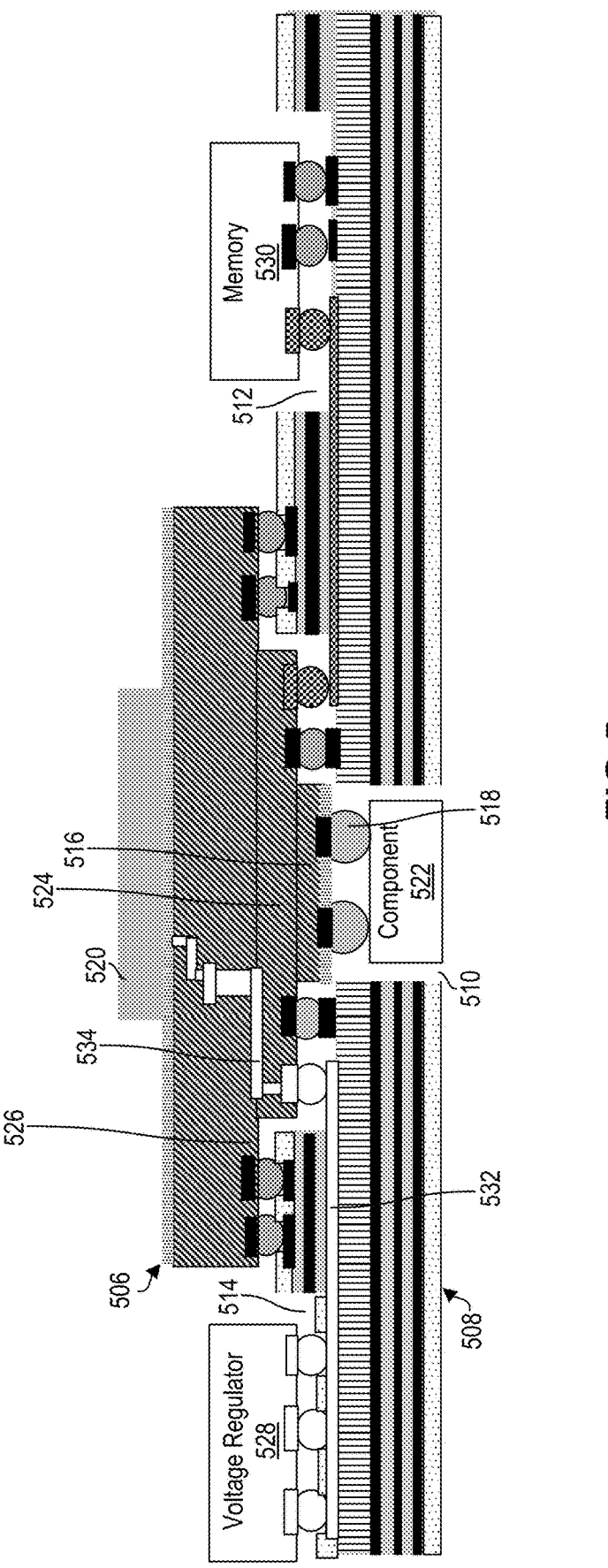
FIG. 5 illustrates a cross section of a multi-tier stepped package and multi-tier recessed circuit board with multiple recessed regions in accordance with certain embodiments.

FIG. 5 illustrates a cross section of a multi-tier stepped package 506 and circuit board 508 with multiple recessed regions in accordance with certain embodiments. The package 506 and circuit board 508 may have any suitable characteristics of other packages and circuit boards described herein (e.g., 106, 206, 306, 406, 108, 208, 308, 408). In this embodiment, the circuit board 508 includes a tiered recessed region to interface with the multi-tier stepped package 506. In this embodiment, the tiered recessed region includes an aperture 510 (e.g., a cutout of a portion that extends all the way through the circuit board 508 across a portion of the circuit board) within the recessed region that interfaces with stepped portion 524. In various embodiments, various layers of the circuit board may be present around the aperture 510, such that the circuit board resembles a donut with a hole in the middle. An electronic component 522 may be placed at least a portion of the way into the aperture 510 and may couple to stepped portion 516 of package 506 through a plurality of solder balls 518, enabling circuitry of chip 520 and/or other circuitry of package 506 to communicate with circuitry of component 522 without passing through an interconnect of a layer of the circuit board 508.

One or more other stepped portions (e.g., 524) or non-stepped portions (e.g., 526) of the package 506 may interface with corresponding recessed or non-recessed portions of the circuit board 508. In one embodiment, a package may include a single stepped portion that interfaces with component 522 through open region 510 and the remaining non-stepped portion may interface with a non-recessed portion of a circuit board.

Component 522 may include any suitable electronic device, such as memory, a power circuitry (e.g., a voltage regulator), or other suitable platform component (such as one of those shown in FIGS. 8-10 below). In various embodiments, component 522 may comprise a package with any suitable circuitry. In one embodiment, component 522 may include another stepped package, such as any of those described herein where one stepped portion of the package may interface with stepped portion 516 of package 506, and one or more other stepped portions of the package and the non-stepped portion of the package may interface with corresponding recessed or non-recessed portions (not shown) on the bottom of the circuit board 508. In various embodiments, any of the recessed portions shown in the figures as being on the top of a circuit board may additionally or alternatively be located at any suitable location on the bottom of the circuit board, whether an aperture 510 is present or not. Thus, a circuit board 508 may include one or more recessed portions on the top of the board as well as one or more recessed portions on the bottom of the board.

The circuit board 508 also includes additional recessed regions 512 and 514 located on different regions of the circuit board from the tiered recessed regions that interface with package 506. For example, these additional recessed regions may be separated from other recessed regions by portions of the circuit board 508 that comprise the entire cross section of the circuit board (e.g., these portions may comprise all conductive layers and insulative layers). These additional recessed regions allow various components (e.g., voltage regulator 528 and memory 530) to couple directly to internal conductive layers of the circuit board 508 rather than coupling to these layers through PTH vias. Thus, in the embodiment depicted, a power signal from voltage regulator 528 may couple directly to the third conductive layer 532 and then up through package interconnect 534 without ever traveling through a PTH via. Similarly, one or more signals from the memory 530 may couple directly to an internal layer of the circuit board 508 and to stepped portion 524 of the package 506.

FIGS. 6A-6H illustrate a flow for forming a stepped package in accordance with certain embodiments. As depicted in FIG. 6A, a plurality of interconnects 604 are formed on both sides of and through (e.g., using vias) a package core 602 during a post core layer process. The core 602 may comprise any suitable material that may provide structural support to the package, such as a fiber reinforced material (e.g., fiberglass). The core 602 may be a dielectric material.

As depicted in FIG. 6B, a release layer 606 is applied over the portions of the package that are to form the non-stepped portion of the package. The release layer 606 may also be referred to as a relief layer and may comprise any suitable material (e.g., an adhesive such as a tape) that facilitates detachment of a later formed portion of the package as described below. In some embodiments, release layer 606 may also include a material (e.g., a laminate) to assist in stopping a laser etch.

As shown in FIG. 6C, additional layers are formed on the top and bottom of the core 602. For example, the additional layers may comprise conductive layers forming interconnects 610 that connect conductive contacts 612 (e.g., solder pads) on one side of the package to conductive contacts 614 on the other side of the package. The additional layers may also include one or more dielectric materials 608 to electrically isolate the interconnects 610. The additional layers may be formed in any suitable manner, such as through lithography, deposition, etching, and/or other process steps.

As depicted in FIG. 6D, solder resist lamination layers 616 and 618 are then applied to both sides of the package. As shown in FIG. 6E, trenches 620 are then formed down to the release layers 606. The trenches 620 may be formed in any suitable manner. For example, they may be made via laser cuts or etching.

In FIG. 6F, the portions of the package bordered by the release layers 606 and the trenches 620 are removed to reveal the non-stepped portion of the package, resulting in a stepped package. In some embodiments, the removal may include peeling off these portions (e.g., when the release layers 606 comprise tape or other adhesive).

In FIG. 6G, the package is flipped over in order to attach solder balls 622 (e.g., using a ball attach jig 624) to the non-stepped and stepped portions of the package that will interface with a circuit board and/or other components comprising circuitry (e.g., packages). The resulting package 626 is shown in FIG. 6H. Further processing steps may be performed to couple one or more semiconductor chips to the package 626.

The flow above may be modified when the package is a multi-tier stepped package. For example, the release layers 606 may be placed at different levels of the package (and trenches may be formed to multiple corresponding levels) before portions are removed to form the multiple stepped portions.

Figures 7D, 7E, 7F, 7G:
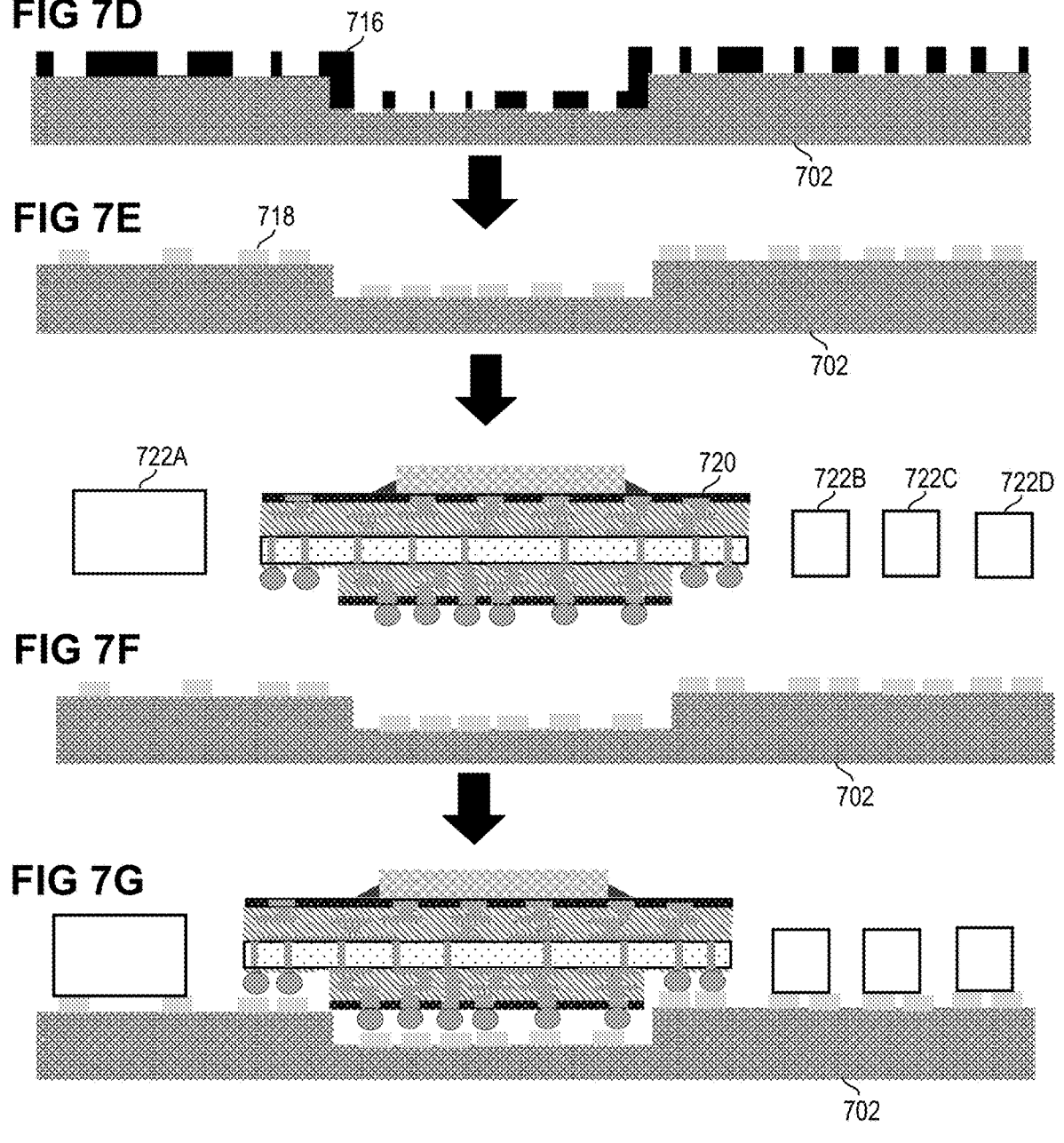

FIGS. 7A-7G illustrates a flow for forming a recessed circuit board to interface with a stepped package in accordance with certain embodiments (cross sections and a top view of the circuit board are shown). FIG. 7A depicts a circuit board 702. During formation of the alternating conductive and insulating layers of the circuit board 702, an internal grid array 706 comprising conductive contacts 708 (e.g., pads for a ball grid array) is formed on a portion of the circuit board that is to be recessed in a later process step. A release layer 710 (which may also be referred to as a relief layer or relief sheet) is formed above the internal grid array 706. The release layer 710 may comprise any suitable material (e.g., adhesive, plastic) facilitating removal of a portion 712 of the circuit board 702 after a trench is formed around the portion 712 down to the level of the release layer 710 (where the boundaries of the trench are shown by the dotted line 713). The release layer 710 may also prevent layers placed above the conductive contacts 708 from bonding with the conductive contacts 708 during lamination of the board.

In some embodiments, the trench may be formed using laser ablation. Referring to FIG. 7B, laser stops 714 may be created at dedicated corners and/or edge of the desired recess to indicate the right depth for layer removal before the entire cavity 712 is removed. The laser stops 714 may be placed on or proximate the same level as the internal grid array 706 to prevent the laser from cutting deeper than desired. In various embodiments, the laser stops may comprise any suitable material, such as copper. Once the trench is formed, the release layer 710 is pulled off of the rest of the circuit board 702 to remove portion 712 as shown in FIG. 7C.

As depicted in FIG. 7D, a three dimensional (3D) stencil 716 may then be applied to the top of the circuit board 702. Solder paste printing may then be performed utilizing the 3D stencil to apply the solder paste to the desired portions (e.g., the solder paste may form conductive contacts or may be placed on conductive contacts) of the circuit board 702. FIG. 7E depicts the resulting solder paste 718, with solder paste on both the non-recessed portion of the board as well as the recessed portion.

FIG. 7F depicts the resulting circuit board 702 as well as a stepped package 720 (which may have any of the characteristics of the other stepped packages described herein) and components 722 (e.g., 722A-D). In FIG. 7G, the stepped package 720 and components 722 are attached to the circuit board 702 (e.g., using a solder reflow process or other suitable attachment procedure).

Figure 8:
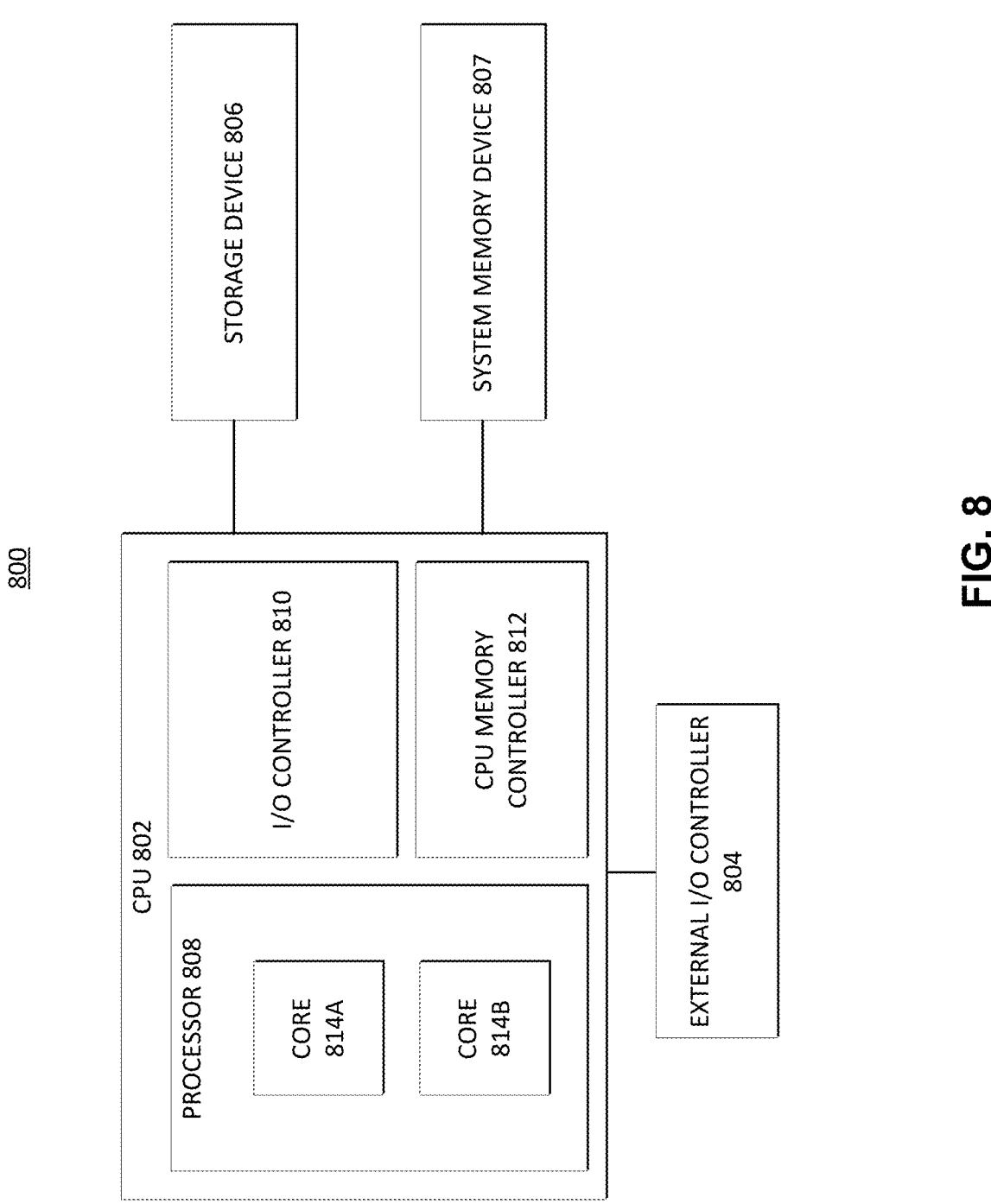
FIG. 8 illustrates an example computer system in accordance with certain embodiments.
Figure 9:
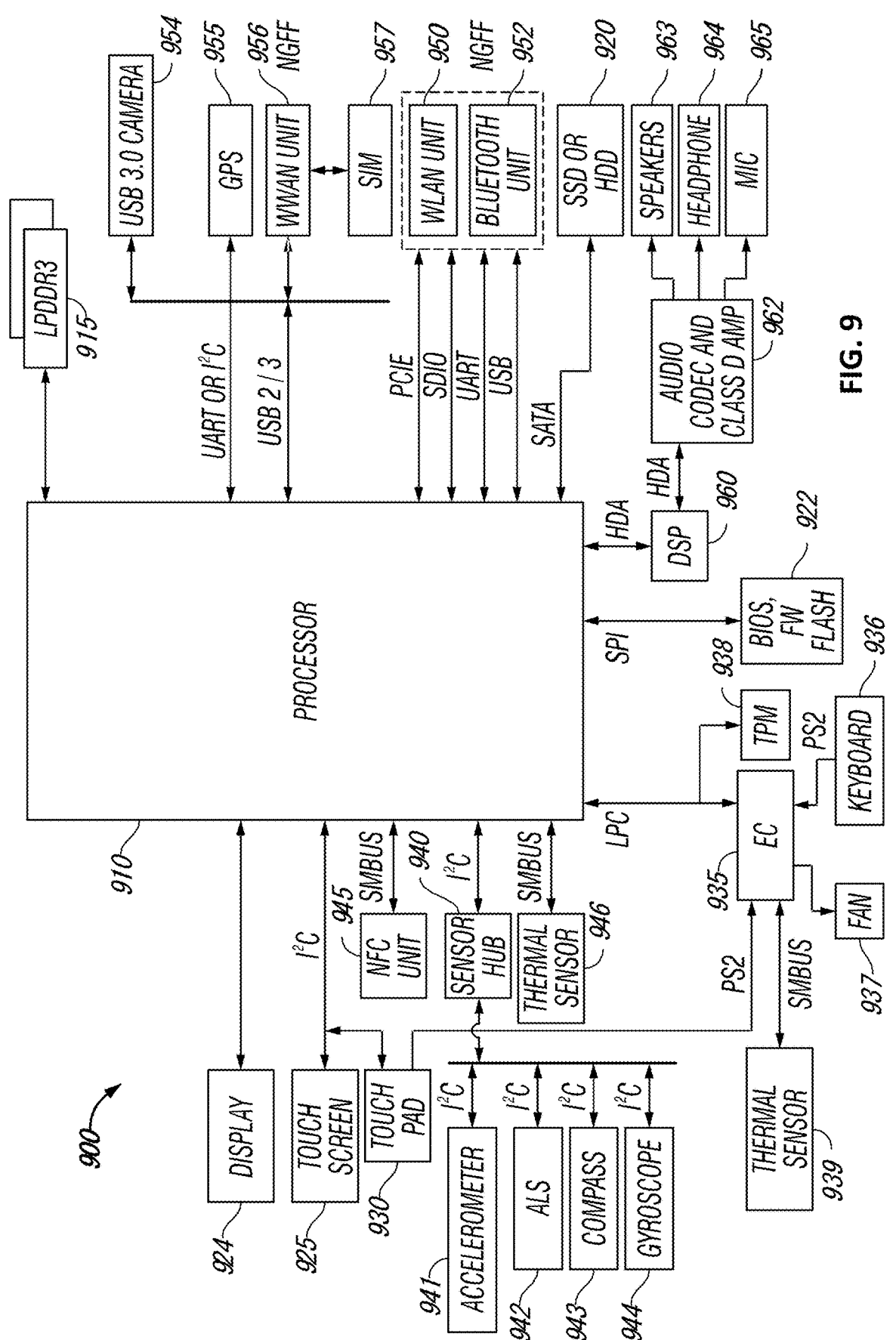
FIG. 9 illustrates a block diagram of components present in a computing system in accordance with various embodiments.
Figure 10:
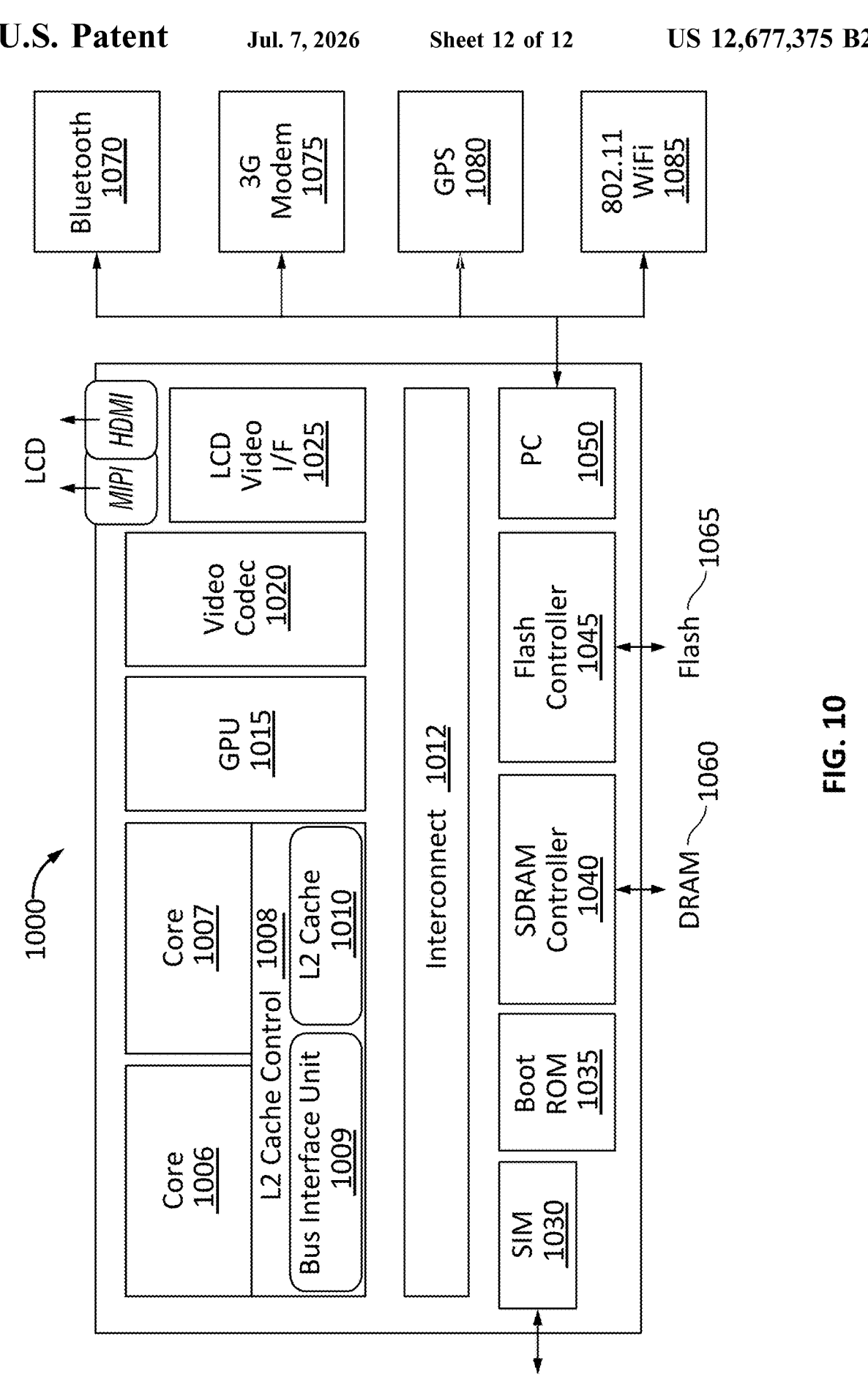
FIG. 10 illustrates a block diagram of another computing system in accordance with various embodiments.

FIGS. 8-10 depict example systems in which various embodiments described herein may be implemented. For example, any of the systems depicted (or one or more components thereof) may include, be coupled to, or be implemented by a stepped package and recessed circuit board described herein.

FIG. 8 illustrates components of a computer system 800 in accordance with certain embodiments. System 800 includes a central processing unit (CPU) 802 coupled to an external input/output (I/O) controller 804, a storage device 806 such as a solid state drive (SSD) or a dual inline memory module (DIMM), and system memory device 807. During operation, data may be transferred between a storage device 806 and/or system memory device 807 and the CPU 802. In various embodiments, particular memory access operations (e.g., read and write operations) involving a storage device 806 or system memory device 807 may be issued by an operating system and/or other software applications executed by processor 808.

CPU 802 comprises a processor 808, such as a microprocessor, an embedded processor, a digital signal processor (DSP), a network processor, a handheld processor, an application processor, a co-processor, an SOC, or other device to execute code (e.g., software instructions). Processor 808, in the depicted embodiment, includes two processing elements (cores 814A and 814B in the depicted embodiment), which may include asymmetric processing elements or symmetric processing elements. However, a processor may include any number of processing elements that may be symmetric or asymmetric. CPU 802 may be referred to herein as a host computing device (though a host computing device may be any suitable computing device operable to issue memory access commands to a storage device 806).

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 814 (e.g., 814A or 814B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

In some embodiments, processor 808 may comprise a processor unit, such as a processor core, graphics processing unit, hardware accelerator, field programmable gate array, neural network processing unit, artificial intelligence processing unit, inference engine, data processing unit, or infrastructure processing unit.

I/O controller 810 is an integrated I/O controller that includes logic for communicating data between CPU 802 and I/O devices. In other embodiments, the I/O controller 810 may be on a different chip from the CPU 802. I/O devices may refer to any suitable devices capable of transferring data to and/or receiving data from an electronic system, such as CPU 802. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input device such as a monitor, printer, mouse, keyboard, or scanner; or other suitable device. In a particular embodiment, an I/O device may comprise a storage device 806 coupled to the CPU 802 through I/O controller 810.

An I/O device may communicate with the I/O controller 810 of the CPU 802 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 810 and an associated I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http:// www.intel.com/content/www/us/en/io/serial-ata/serial-ata-ahci-spec-rev1-3-1.html). In various embodiments, I/O devices coupled to the I/O controller 810 may be located off-chip (e.g., not on the same chip as CPU 802) or may be integrated on the same chip as the CPU 802.

CPU memory controller 812 is an integrated memory controller that controls the flow of data going to and from one or more system memory devices 807. CPU memory controller 812 may include logic operable to read from a system memory device 807, write to a system memory device 807, or to request other operations from a system memory device 807. In various embodiments, CPU memory controller 812 may receive write requests from cores 814 and/or I/O controller 810 and may provide data specified in these requests to a system memory device 807 for storage therein. CPU memory controller 812 may also read data from a system memory device 807 and provide the read data to I/O controller 810 or a core 814. During operation, CPU memory controller 812 may issue commands including one or more addresses of the system memory device 807 in order to read data from or write data to memory (or to perform other operations). In some embodiments, CPU memory controller 812 may be implemented on the same chip as CPU 802, whereas in other embodiments, CPU memory controller 812 may be implemented on a different chip than that of CPU 802. I/O controller 810 may perform similar operations with respect to one or more storage devices 806.

The CPU 802 may also be coupled to one or more other I/O devices through external I/O controller 804. In a particular embodiment, external I/O controller 804 may couple a storage device 806 to the CPU 802. External I/O controller 804 may include logic to manage the flow of data between one or more CPUs 802 and I/O devices. In particular embodiments, external I/O controller 804 is located on a motherboard along with the CPU 802. The external I/O controller 804 may exchange information with components of CPU 802 using point-to-point or other interfaces.

A system memory device 807 may store any suitable data, such as data used by processor 808 to provide the functionality of computer system 800. For example, data associated with programs that are executed or files accessed by cores 814 may be stored in system memory device 807. Thus, a system memory device 807 may include a system memory that stores data and/or sequences of instructions that are executed or otherwise used by the cores 814. In various embodiments, a system memory device 807 may store temporary data, persistent data (e.g., a user's files or instruction sequences) that maintains its state even after power to the system memory device 807 is removed, or a combination thereof. A system memory device 807 may be dedicated to a particular CPU 802 or shared with other devices (e.g., one or more other processors or other devices) of computer system 800.

In various embodiments, a system memory device 807 may include a memory comprising any number of memory partitions, a memory device controller, and other supporting logic (not shown). A memory partition may include non-volatile memory and/or volatile memory.

Non-volatile memory is a storage medium that does not require power to maintain the state of data stored by the medium, thus non-volatile memory may have a determinate state even if power is interrupted to the device housing the memory. Nonlimiting examples of nonvolatile memory may include any or a combination of: 3D crosspoint memory, phase change memory (e.g., memory that uses a chalcogenide glass phase change material in the memory cells), ferroelectric memory, silicon-oxide-nitride-oxide-silicon (SONOS) memory, polymer memory (e.g., ferroelectric polymer memory), ferroelectric transistor random access memory (Fe-TRAM) ovonic memory, anti-ferroelectric memory, nanowire memory, electrically erasable programmable read-only memory (EEPROM), a memristor, single or multi-level phase change memory (PCM), Spin Hall Effect Magnetic RAM (SHE-MRAM), and Spin Transfer Torque Magnetic RAM (STTRAM), a resistive memory, magnetoresistive random access memory (MRAM) memory that incorporates memristor technology, resistive memory including the metal oxide base, the oxygen vacancy base and the conductive bridge Random Access Memory (CB-RAM), a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory.

Volatile memory is a storage medium that requires power to maintain the state of data stored by the medium (thus volatile memory is memory whose state (and therefore the data stored on it) is indeterminate if power is interrupted to the device housing the memory). Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications.

A storage device 806 may store any suitable data, such as data used by processor 808 to provide functionality of computer system 800. For example, data associated with programs that are executed or files accessed by cores 814A and 814B may be stored in storage device 806. Thus, in some embodiments, a storage device 806 may store data and/or sequences of instructions that are executed or otherwise used by the cores 814A and 814B. In various embodiments, a storage device 806 may store persistent data (e.g., a user's files or software application code) that maintains its state even after power to the storage device 806 is removed. A storage device 806 may be dedicated to CPU 802 or shared with other devices (e.g., another CPU or other device) of computer system 800.

In various embodiments, storage device 806 may comprise a disk drive (e.g., a solid state drive); a memory card; a Universal Serial Bus (USB) drive; a Dual In-line Memory Module (DIMM), such as a Non-Volatile DIMM (NVDIMM); storage integrated within a device such as a smartphone, camera, or media player; or other suitable mass storage device.

In a particular embodiment, a semiconductor chip may be embodied in a semiconductor package. In various embodiments, a semiconductor package may comprise a casing comprising one or more semiconductor chips (also referred to as dies). A package may also comprise contact pins or leads used to connect to external circuits.

In some embodiments, all or some of the elements of system 800 are resident on (or coupled to) the same circuit board (e.g., a motherboard). In various embodiments, any suitable partitioning between the elements may exist. For example, the elements depicted in CPU 802 may be located on a single die (e.g., on-chip) or package or any of the elements of CPU 802 may be located off-chip or off-package. Similarly, the elements depicted in storage device 806 may be located on a single chip or on multiple chips. In various embodiments, a storage device 806 and a computing host (e.g., CPU 802) may be located on the same circuit board or on the same device and in other embodiments the storage device 806 and the computing host may be located on different circuit boards or devices.

The components of system 800 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments, an integrated I/O subsystem includes point-to-point multiplexing logic between various components of system 800, such as cores 814, one or more CPU memory controllers 812, I/O controller 810, integrated I/O devices, direct memory access (DMA) logic (not shown), etc. In various embodiments, components of computer system 800 may be coupled together through one or more networks comprising any number of intervening network nodes, such as routers, switches, or other computing devices. For example, a computing host (e.g., CPU 802) and the storage device 806 may be communicably coupled through a network.

Although not depicted, system 800 may use a battery and/or power supply outlet connector and associated system to receive power, a display to output data provided by CPU 802, or a network interface allowing the CPU 802 to communicate over a network. In various embodiments, the battery, power supply outlet connector, display, and/or network interface may be communicatively coupled to CPU 802. Other sources of power can be used such as renewable energy (e.g., solar power or motion based power).

Referring now to FIG. 9, a block diagram of components present in a computer system that may function as either a host device or a peripheral device (or which may include both a host device and one or more peripheral devices) in accordance with certain embodiments is described. As shown in FIG. 9, system 900 includes any combination of components. These components may be implemented as ICs, portions thereof, discrete electronic devices, or other modules, logic, hardware, software, firmware, or a combination thereof adapted in a computer system, or as components otherwise incorporated within a chassis of the computer system. Note also that the block diagram of FIG. 9 is intended to show a high level view of many components of the computer system. However, it is to be understood that some of the components shown may be omitted, additional components may be present, and different arrangement of the components shown may occur in other implementations. As a result, the disclosure described above may be implemented in any portion of one or more of the interconnects illustrated or described below.

As seen in FIG. 9, a processor 910, in one embodiment, includes a microprocessor, multi-core processor, multi-threaded processor, an ultra-low voltage processor, an embedded processor, or other known processing element. In the illustrated implementation, processor 910 acts as a main processing unit and central hub for communication with many of the various components of the system 900. As one example, processor 910 is implemented as a system on a chip (SoC). As a specific illustrative example, processor 910 includes an Intel® Architecture Core™-based processor such as an i3, i5, i7 or another such processor available from Intel Corporation, Santa Clara, CA. However, other low power processors such as those available from Advanced Micro Devices, Inc. (AMD) of Sunnyvale, CA, a MIPS-based design from MIPS Technologies, Inc. of Sunnyvale, CA, an ARM-based design licensed from ARM Holdings, Ltd. or customer thereof, or their licensees or adopters may instead be present in other embodiments such as an Apple A5/A6 processor, a Qualcomm Snapdragon processor, or TI OMAP processor. Note that many of the customer versions of such processors are modified and varied; however, they may support or recognize a specific instructions set that performs defined algorithms as set forth by the processor licensor. Here, the microarchitecture implementation may vary, but the architectural function of the processor is usually consistent. Certain details regarding the architecture and operation of processor 910 in one implementation will be discussed further below to provide an illustrative example.

Processor 910, in one embodiment, communicates with a system memory 915. As an illustrative example, which in an embodiment can be implemented via multiple memory devices to provide for a given amount of system memory. As examples, the memory can be in accordance with a Joint Electron Devices Engineering Council (JEDEC) low power double data rate (LPDDR)-based design such as the current LPDDR2 standard according to JEDEC JESD 209-2E (published April 2009), or a next generation LPDDR standard to be referred to as LPDDR3 or LPDDR4 that will offer extensions to LPDDR2 to increase bandwidth. In various implementations the individual memory devices may be of different package types such as single die package (SDP), dual die package (DDP) or quad die package (QDP). These devices, in some embodiments, are directly soldered onto a motherboard to provide a lower profile solution, while in other embodiments the devices are configured as one or more memory modules that in turn couple to the motherboard by a given connector. And of course, other memory implementations are possible such as other types of memory modules, e.g., dual inline memory modules (DIMMs) of different varieties including but not limited to microDIMMs, MiniDIMMs. In a particular illustrative embodiment, memory is sized between 2 GB and 16 GB, and may be configured as a DDR3LM package or an LPDDR2 or LPDDR3 memory that is soldered onto a motherboard via a ball grid array (BGA).

To provide for persistent storage of information such as data, applications, one or more operating systems and so forth, a mass storage 920 may also couple to processor 910. In various embodiments, to enable a thinner and lighter system design as well as to improve system responsiveness, this mass storage may be implemented via a SSD. However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also shown in FIG. 9, a flash device 922 may be coupled to processor 910, e.g., via a serial peripheral interface (SPI). This flash device may provide for non-volatile storage of system software, including a basic input/output software (BIOS) as well as other firmware of the system.

In various embodiments, mass storage of the system is implemented by a SSD alone or as a disk, optical or other drive with an SSD cache. In some embodiments, the mass storage is implemented as a SSD or as a HDD along with a restore (RST) cache module. In various implementations, the HDD provides for storage of between 320 GB-4 terabytes (TB) and upward while the RST cache is implemented with a SSD having a capacity of 24 GB-256 GB. Note that such SSD cache may be configured as a single level cache (SLC) or multi-level cache (MLC) option to provide an appropriate level of responsiveness. In a SSD-only option, the module may be accommodated in various locations such as in a mSATA or NGFF slot. As an example, an SSD has a capacity ranging from 120 GB-1 TB.

Various input/output (IO) devices may be present within system 900. Specifically shown in the embodiment of FIG. 9 is a display 924 which may be a high definition LCD or LED panel configured within a lid portion of the chassis. This display panel may also provide for a touch screen 925, e.g., adapted externally over the display panel such that via a user's interaction with this touch screen, user inputs can be provided to the system to enable desired operations, e.g., with regard to the display of information, accessing of information and so forth. In one embodiment, display 924 may be coupled to processor 910 via a display interconnect that can be implemented as a high performance graphics interconnect. Touch screen 925 may be coupled to processor 910 via another interconnect, which in an embodiment can be an I2C interconnect. As further shown in FIG. 9, in addition to touch screen 925, user input by way of touch can also occur via a touch pad 930 which may be configured within the chassis and may also be coupled to the same I2C interconnect as touch screen 925.

The display panel may operate in multiple modes. In a first mode, the display panel can be arranged in a transparent state in which the display panel is transparent to visible light. In various embodiments, the majority of the display panel may be a display except for a bezel around the periphery. When the system is operated in a notebook mode and the display panel is operated in a transparent state, a user may view information that is presented on the display panel while also being able to view objects behind the display. In addition, information displayed on the display panel may be viewed by a user positioned behind the display. Or the operating state of the display panel can be an opaque state in which visible light does not transmit through the display panel.

In a tablet mode the system is folded shut such that the back display surface of the display panel comes to rest in a position such that it faces outwardly towards a user, when the bottom surface of the base panel is rested on a surface or held by the user. In the tablet mode of operation, the back display surface performs the role of a display and user interface, as this surface may have touch screen functionality and may perform other known functions of a conventional touch screen device, such as a tablet device. To this end, the display panel may include a transparency-adjusting layer that is disposed between a touch screen layer and a front display surface. In some embodiments the transparency-adjusting layer may be an electrochromic layer (EC), a LCD layer, or a combination of EC and LCD layers.

In various embodiments, the display can be of different sizes, e.g., an 11.6″ or a 13.3″ screen, and may have a 16:9 aspect ratio, and at least 300 nits brightness. Also the display may be of full high definition (HD) resolution (at least 1920×1080p), be compatible with an embedded display port (eDP), and be a low power panel with panel self refresh.

As to touch screen capabilities, the system may provide for a display multi-touch panel that is multi-touch capacitive and being at least 5 finger capable. And in some embodiments, the display may be 10 finger capable. In one embodiment, the touch screen is accommodated within a damage and scratch-resistant glass and coating (e.g., Gorilla Glass™ or Gorilla Glass 2™) for low friction to reduce "finger burn" and avoid "finger skipping". To provide for an enhanced touch experience and responsiveness, the touch panel, in some implementations, has multi-touch functionality, such as less than 2 frames (30 Hz) per static view during pinch zoom, and single-touch functionality of less than 1 cm per frame (30 Hz) with 200 ms (lag on finger to pointer). The display, in some implementations, supports edge-to-edge glass with a minimal screen bezel that is also flush with the panel surface, and limited IO interference when using multi-touch.

For perceptual computing and other purposes, various sensors may be present within the system and may be coupled to processor 910 in different manners. Certain inertial and environmental sensors may couple to processor 910 through a sensor hub 940, e.g., via an I2C interconnect. In the embodiment shown in FIG. 9, these sensors may include an accelerometer 941, an ambient light sensor (ALS) 942, a compass 943 and a gyroscope 944. Other environmental sensors may include one or more thermal sensors 946 which in some embodiments couple to processor 910 via a system management bus (SMBus) bus.

Using the various inertial and environmental sensors present in a platform, many different use cases may be realized. These use cases enable advanced computing operations including perceptual computing and also allow for enhancements with regard to power management/battery life, security, and system responsiveness.

For example, with regard to power management/battery life issues, based at least on part on information from an ambient light sensor, the ambient light conditions in a location of the platform are determined and intensity of the display controlled accordingly. Thus, power consumed in operating the display is reduced in certain light conditions.

As to security operations, based on context information obtained from the sensors such as location information, it may be determined whether a user is allowed to access certain secure documents. For example, a user may be permitted to access such documents at a work place or a home location. However, the user is prevented from accessing such documents when the platform is present at a public location. This determination, in one embodiment, is based on location information, e.g., determined via a GPS sensor or camera recognition of landmarks. Other security operations may include providing for pairing of devices within a close range of each other, e.g., a portable platform as described herein and a user's desktop computer, mobile telephone or so forth. Certain sharing, in some implementations, are realized via near field communication when these devices are so paired. However, when the devices exceed a certain range, such sharing may be disabled. Furthermore, when pairing a platform as described herein and a smartphone, an alarm may be configured to be triggered when the devices move more than a predetermined distance from each other, when in a public location. In contrast, when these paired devices are in a safe location, e.g., a work place or home location, the devices may exceed this predetermined limit without triggering such alarm.

Responsiveness may also be enhanced using the sensor information. For example, even when a platform is in a low power state, the sensors may still be enabled to run at a relatively low frequency. Accordingly, any changes in a location of the platform, e.g., as determined by inertial sensors, GPS sensor, or so forth is determined. If no such changes have been registered, a faster connection to a previous wireless hub such as a Wi-Fi™ access point or similar wireless enabler occurs, as there is no need to scan for available wireless network resources in this case. Thus, a greater level of responsiveness when waking from a low power state is achieved.

It is to be understood that many other use cases may be enabled using sensor information obtained via the integrated sensors within a platform as described herein, and the above examples are only for purposes of illustration. Using a system as described herein, a perceptual computing system may allow for the addition of alternative input modalities, including gesture recognition, and enable the system to sense user operations and intent.

In some embodiments one or more infrared or other heat sensing elements, or any other element for sensing the presence or movement of a user may be present. Such sensing elements may include multiple different elements working together, working in sequence, or both. For example, sensing elements include elements that provide initial sensing, such as light or sound projection, followed by sensing for gesture detection by, for example, an ultrasonic time of flight camera or a patterned light camera.

Also in some embodiments, the system includes a light generator to produce an illuminated line. In some embodiments, this line provides a visual cue regarding a virtual boundary, namely an imaginary or virtual location in space, where action of the user to pass or break through the virtual boundary or plane is interpreted as an intent to engage with the computing system. In some embodiments, the illuminated line may change colors as the computing system transitions into different states with regard to the user. The illuminated line may be used to provide a visual cue for the user of a virtual boundary in space, and may be used by the system to determine transitions in state of the computer with regard to the user, including determining when the user wishes to engage with the computer.

In some embodiments, the computer senses user position and operates to interpret the movement of a hand of the user through the virtual boundary as a gesture indicating an intention of the user to engage with the computer. In some embodiments, upon the user passing through the virtual line or plane the light generated by the light generator may change, thereby providing visual feedback to the user that the user has entered an area for providing gestures to provide input to the computer.

Display screens may provide visual indications of transitions of state of the computing system with regard to a user. In some embodiments, a first screen is provided in a first state in which the presence of a user is sensed by the system, such as through use of one or more of the sensing elements.

In some implementations, the system acts to sense user identity, such as by facial recognition. Here, transition to a second screen may be provided in a second state, in which the computing system has recognized the user identity, where this second the screen provides visual feedback to the user that the user has transitioned into a new state. Transition to a third screen may occur in a third state in which the user has confirmed recognition of the user.

In some embodiments, the computing system may use a transition mechanism to determine a location of a virtual boundary for a user, where the location of the virtual boundary may vary with user and context. The computing system may generate a light, such as an illuminated line, to indicate the virtual boundary for engaging with the system. In some embodiments, the computing system may be in a waiting state, and the light may be produced in a first color. The computing system may detect whether the user has reached past the virtual boundary, such as by sensing the presence and movement of the user using sensing elements.

In some embodiments, if the user has been detected as having crossed the virtual boundary (such as the hands of the user being closer to the computing system than the virtual boundary line), the computing system may transition to a state for receiving gesture inputs from the user, where a mechanism to indicate the transition may include the light indicating the virtual boundary changing to a second color.

In some embodiments, the computing system may then determine whether gesture movement is detected. If gesture movement is detected, the computing system may proceed with a gesture recognition process, which may include the use of data from a gesture data library, which may reside in memory in the computing device or may be otherwise accessed by the computing device.

If a gesture of the user is recognized, the computing system may perform a function in response to the input, and return to receive additional gestures if the user is within the virtual boundary. In some embodiments, if the gesture is not recognized, the computing system may transition into an error state, where a mechanism to indicate the error state may include the light indicating the virtual boundary changing to a third color, with the system returning to receive additional gestures if the user is within the virtual boundary for engaging with the computing system.

As mentioned above, in other embodiments the system can be configured as a convertible tablet system that can be used in at least two different modes, a tablet mode and a notebook mode. The convertible system may have two panels, namely a display panel and a base panel such that in the tablet mode the two panels are disposed in a stack on top of one another. In the tablet mode, the display panel faces outwardly and may provide touch screen functionality as found in conventional tablets. In the notebook mode, the two panels may be arranged in an open clamshell configuration.

In various embodiments, the accelerometer may be a 3-axis accelerometer having data rates of at least 50 Hz. A gyroscope may also be included, which can be a 3-axis gyroscope. In addition, an e-compass/magnetometer may be present. Also, one or more proximity sensors may be provided (e.g., for lid open to sense when a person is in proximity (or not) to the system and adjust power/performance to extend battery life). For some OS's Sensor Fusion capability including the accelerometer, gyroscope, and compass may provide enhanced features. In addition, via a sensor hub having a real-time clock (RTC), a wake from sensors mechanism may be realized to receive sensor input when a remainder of the system is in a low power state.

In some embodiments, an internal lid/display open switch or sensor to indicate when the lid is closed/open, and can be used to place the system into Connected Standby or automatically wake from Connected Standby state. Other system sensors can include ACPI sensors for internal processor, memory, and skin temperature monitoring to enable changes to processor and system operating states based on sensed parameters.

Also seen in FIG. 9, various peripheral devices may couple to processor 910. In the embodiment shown, various components can be coupled through an embedded controller 935. Such components can include a keyboard 936 (e.g., coupled via a PS2 interface), a fan 937, and a thermal sensor 939. In some embodiments, touch pad 930 may also couple to EC 935 via a PS2 interface. In addition, a security processor such as a trusted platform module (TPM) 938 in accordance with the Trusted Computing Group (TCG) TPM Specification Version 1.2, dated Oct. 2, 2003, may also couple to processor 910 via this LPC interconnect. However, understand the scope of the present disclosure is not limited in this regard and secure processing and storage of secure information may be in another protected location such as a static random access memory (SRAM) in a security coprocessor, or as encrypted data blobs that are only decrypted when protected by a secure enclave (SE) processor mode.

In a particular implementation, peripheral ports may include a high definition media interface (HDMI) connector (which can be of different form factors such as full size, mini or micro); one or more USB ports, such as full-size external ports in accordance with the Universal Serial Bus (USB) Revision 3.2 Specification (September 2017), with at least one powered for charging of USB devices (such as smartphones) when the system is in Connected Standby state and is plugged into AC wall power. In addition, one or more Thunderbolt™ ports can be provided. Other ports may include an externally accessible card reader such as a full size SD-XC card reader and/or a SIM card reader for WWAN (e.g., an 8 pin card reader). For audio, a 3.5 mm jack with stereo sound and microphone capability (e.g., combination functionality) can be present, with support for jack detection (e.g., headphone only support using microphone in the lid or headphone with microphone in cable). In some embodiments, this jack can be re-taskable between stereo headphone and stereo microphone input. Also, a power jack can be provided for coupling to an AC brick.

System 900 can communicate with external devices in a variety of manners, including wirelessly. In the embodiment shown in FIG. 9, various wireless modules, each of which can correspond to a radio configured for a particular wireless communication protocol, are present. One manner for wireless communication in a short range such as a near field may be via a near field communication (NFC) unit 945 which may communicate, in one embodiment with processor 910 via an SMBus. Note that via this NFC unit 945, devices in close proximity to each other can communicate. For example, a user can enable system 900 to communicate with another portable device such as a smartphone of the user via adapting the two devices together in close relation and enabling transfer of information such as identification information payment information, data such as image data or so forth. Wireless power transfer may also be performed using a NFC system.

Using the NFC unit described herein, users can bump devices side-to-side and place devices side-by-side for near field coupling functions (such as near field communication and wireless power transfer (WPT)) by leveraging the coupling between coils of one or more of such devices. More specifically, embodiments provide devices with strategically shaped, and placed, ferrite materials, to provide for better coupling of the coils. Each coil has an inductance associated with it, which can be chosen in conjunction with the resistive, capacitive, and other features of the system to enable a common resonant frequency for the system.

As further seen in FIG. 9, additional wireless units can include other short range wireless engines including a WLAN unit 950 and a Bluetooth unit 952. Using WLAN unit 950, Wi-Fi™ communications in accordance with a given Institute of Electrical and Electronics Engineers (IEEE) 802.11 standard can be realized, while via Bluetooth unit 952, short range communications via a Bluetooth protocol can occur. These units may communicate with processor 910 via, e.g., a USB link or a universal asynchronous receiver transmitter (UART) link. Or these units may couple to processor 910 via an interconnect according to a Peripheral Component Interconnect Express™ (PCIe™) protocol, e.g., in accordance with the PCI Express™ Specification Base Specification version 3.0 (published Jan. 17, 2007), or another such protocol such as a serial data input/output (SDIO) standard. Of course, the actual physical connection between these peripheral devices, which may be configured on one or more add-in cards, can be by way of the NGFF connectors adapted to a motherboard.

In addition, wireless wide area communications, e.g., according to a cellular or other wireless wide area protocol, can occur via a WWAN unit 956 which in turn may couple to a subscriber identity module (SIM) 957. In addition, to enable receipt and use of location information, a GPS module 955 may also be present. Note that in the embodiment shown in FIG. 9, WWAN unit 956 and an integrated capture device such as a camera module 954 may communicate via a given USB protocol such as a USB 2.0 or 3.0 link, or a UART or I2C protocol. Again, the actual physical connection of these units can be via adaptation of a NGFF add-in card to an NGFF connector configured on the motherboard.

In a particular embodiment, wireless functionality can be provided modularly, e.g., with a WiFi™ 802.11ac solution (e.g., add-in card that is backward compatible with IEEE 802.11abgn) with support for Windows 8 CS. This card can be configured in an internal slot (e.g., via an NGFF adapter). An additional module may provide for Bluetooth capability (e.g., Bluetooth 4.0 with backwards compatibility) as well as Intel® Wireless Display functionality. In addition NFC support may be provided via a separate device or multifunction device, and can be positioned as an example, in a front right portion of the chassis for easy access. A still additional module may be a WWAN device that can provide support for 3G/4G/LTE and GPS. This module can be implemented in an internal (e.g., NGFF) slot. Integrated antenna support can be provided for WiFi™, Bluetooth, WWAN, NFC and GPS, enabling seamless transition from WiFi™ to WWAN radios, wireless gigabit (WiGig) in accordance with the Wireless Gigabit Specification (July 2010), and vice versa.

As described above, an integrated camera can be incorporated in the lid. As one example, this camera can be a high resolution camera, e.g., having a resolution of at least 2.0 megapixels (MP) and extending to 6.0 MP and beyond.

To provide for audio inputs and outputs, an audio processor can be implemented via a digital signal processor (DSP) 960, which may couple to processor 910 via a high definition audio (HDA) link. Similarly, DSP 960 may communicate with an integrated coder/decoder (CODEC) and amplifier 962 that in turn may couple to output speakers 963 which may be implemented within the chassis. Similarly, amplifier and CODEC 962 can be coupled to receive audio inputs from a microphone 965 which in an embodiment can be implemented via dual array microphones (such as a digital microphone array) to provide for high quality audio inputs to enable voice-activated control of various operations within the system. Note also that audio outputs can be provided from amplifier/CODEC 962 to a headphone jack 964. Although shown with these particular components in the embodiment of FIG. 9, understand the scope of the present disclosure is not limited in this regard.

In a particular embodiment, the digital audio codec and amplifier are capable of driving the stereo headphone jack, stereo microphone jack, an internal microphone array and stereo speakers. In different implementations, the codec can be integrated into an audio DSP or coupled via an HD audio path to a peripheral controller hub (PCH). In some implementations, in addition to integrated stereo speakers, one or more bass speakers can be provided, and the speaker solution can support DTS audio.

In some embodiments, processor 910 may be powered by an external voltage regulator (VR) and multiple internal voltage regulators that are integrated inside the processor die, referred to as fully integrated voltage regulators (FIVRs). The use of multiple FIVRs in the processor enables the grouping of components into separate power planes, such that power is regulated and supplied by the FIVR to only those components in the group. During power management, a given power plane of one FIVR may be powered down or off when the processor is placed into a certain low power state, while another power plane of another FIVR remains active, or fully powered.

Power control in the processor can lead to enhanced power savings. For example, power can be dynamically allocated between cores, individual cores can change frequency/voltage, and multiple deep low power states can be provided to enable very low power consumption. In addition, dynamic control of the cores or independent core portions can provide for reduced power consumption by powering off components when they are not being used.

In different implementations, a security module such as a TPM can be integrated into a processor or can be a discrete device such as a TPM 2.0 device. With an integrated security module, also referred to as Platform Trust Technology (PTT), BIOS/firmware can be enabled to expose certain hardware features for certain security features, including secure instructions, secure boot, Intel® Anti-Theft Technology, Intel® Identity Protection Technology, Intel® Trusted Execution Technology (TxT), and Intel® Manageability Engine Technology along with secure user interfaces such as a secure keyboard and display.

Turning next to FIG. 10, another block diagram for an example computing system that may serve as a host device or peripheral device (or may include both a host device and one or more peripheral devices) in accordance with certain embodiments is shown. As a specific illustrative example, SoC 1000 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SoC 1000 includes 2 cores-1006 and 1007. Similar to the discussion above, cores 1006 and 1007 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 1006 and 1007 are coupled to cache control 1008 that is associated with bus interface unit 1009 and L2 cache 1010 to communicate with other parts of system 1000. Interconnect 1012 includes an on-chip interconnect, such as an IOSF, AMBA, or other interconnect discussed above, which potentially implements one or more aspects of the described disclosure.

Interconnect 1012 provides communication channels to the other components, such as a Subscriber Identity Module (SIM) 1030 to interface with a SIM card, a boot rom 1035 to hold boot code for execution by cores 1006 and 1007 to initialize and boot SoC 1000, a SDRAM controller 1040 to interface with external memory (e.g. DRAM 1060), a flash controller 1045 to interface with non-volatile memory (e.g. Flash 1065), a peripheral control 1050 (e.g. Serial Peripheral Interface) to interface with peripherals, video codecs 1020 and Video interface 1025 to display and receive input (e.g. touch enabled input), GPU 1015 to perform graphics related computations, etc. Any of these interfaces may incorporate aspects of the disclosure described herein.

In addition, the system illustrates peripherals for communication, such as a Bluetooth module 1070, 3G modem 1075, GPS 1080, and WiFi 1085. Note as stated above, a UE includes a radio for communication. As a result, these peripheral communication modules are not all required. However, in a UE some form of a radio for external communication is to be included.

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and hand-held PCs. Embedded applications may include, e.g., a microcontroller, a digital signal processor (DSP), an SOC, a network computer (NetPC), a set-top box, a network hub, a wide area network (WAN) switch, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

A module as used herein or as depicted in the FIGs. refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the flows described or functionality of the various components of the FIGs., subcomponents thereof, or other entity or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A machine-accessible/readable medium includes any mechanism that provides (i.e., stores and/or transmits) information in a form readable by a machine, such as a computer or electronic system. For example, a machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

Example 1 includes an apparatus comprising a package comprising a first side to interface with at least one chip; and a second side to interface with a circuit board, the second side opposite to the first side, wherein the second side comprises a non-stepped portion comprising a first plurality of conductive contacts; and a stepped portion that protrudes from the non-stepped portion, the stepped portion comprising a second plurality of conductive contacts.

Example 2 includes the subject matter of Example 1, and wherein the non-stepped portion comprises a first plurality of solder balls coupled to the first plurality of conductive contacts, wherein the stepped portion comprises a second plurality of solder balls coupled to the second plurality of conductive contacts.

Example 3 includes the subject matter of any of Examples 1 and 2, and wherein the second plurality of solder balls have a height that is larger than a height of the first plurality of solder balls.

Example 4 includes the subject matter of any of Examples 1-3, and wherein the second side further comprises a second stepped portion that protrudes from the stepped portion, the second stepped portion comprising a third plurality of conductive contacts.

Example 5 includes the subject matter of any of Examples 1-4, and wherein the second stepped portion is to interface with a second package through an aperture of the circuit board.

Example 6 includes the subject matter of any of Examples 1-5, and wherein the first plurality of conductive contacts and the second plurality of conductive contacts are arranged in a grid array.

Example 7 includes the subject matter of any of Examples 1-6, and wherein the package comprises a chip coupled to the first side of the package.

Example 8 includes the subject matter of any of Examples 1-7, and wherein the non-stepped portion surrounds the stepped portion.

Example 9 includes the subject matter of any of Examples 1-8, and further including the circuit board, the circuit board comprising a non-recessed portion to interface with the non-stepped portion of the second side of the package; and a recessed portion to interface with the stepped portion of the second side of the package.

Example 10 includes the subject matter of any of Examples 1-9, and wherein the circuit board comprises an aperture within the recessed portion, wherein the apparatus comprises a second package coupled to the package through the aperture.

Example 11 includes the subject matter of any of Examples 1-10, and wherein the second package comprises a side with a non-stepped portion and a stepped portion, wherein the stepped portion of the second package is coupled to the package through the aperture.

Example 12 includes the subject matter of any of Examples 1-11, and wherein the package comprises a chip comprising a processor.

Example 13 includes the subject matter of any of Examples 1-12, further comprising a battery communicatively coupled to the processor, a display communicatively coupled to the processor, or a network interface communicatively coupled to the processor.

Example 14 includes a circuit board comprising a plurality of conductive layers comprising a top conductive layer, a bottom conductive layer, and a plurality of internal conductive layers between the top conductive layer and the bottom conductive layer; and a first side comprising a non-recessed portion and a recessed portion, wherein the non-recessed portion comprises a plurality of conductive contacts to the top conductive layer, wherein the recessed portion comprises a second plurality of conductive contacts to an internal conductive layer of the plurality of conductive layers.

Example 15 includes the subject matter of Example 14, the first side comprising a second recessed portion, the second recessed portion recessed within at least a portion of the recessed portion, wherein the second recessed portion comprises a third plurality of conductive contacts to a second internal conductive layer of the plurality of conductive layers.

Example 16 includes the subject matter of any of Examples 14-15, the first side comprising a second recessed portion comprising a third plurality of conductive contacts to an internal conductive layer of the plurality of conductive layers, wherein the recessed portion is to interface with a portion of a package comprising a central processing unit, wherein the second recessed portion is to interface with a second package.

Example 17 includes the subject matter of any of Examples 14-16, and further including an aperture within the recessed portion.

Example 18 includes the subject matter of any of Examples 14-17, and further including a second side opposite the first side, the second side comprising a second non-recessed portion and a second recessed portion, wherein the second non-recessed portion comprises a third plurality of conductive contacts to the bottom conductive layer, wherein the second recessed portion comprises a fourth plurality of conductive contacts to a second internal conductive layer of the plurality of internal conductive layers.

Example 19 includes a method comprising forming a package, the package comprising a first side to interface with at least one chip; a second side to interface with a circuit board, the second side opposite to the first side, wherein the second side comprises a non-stepped portion comprising a first plurality of conductive contacts; and a stepped portion that protrudes from the non-stepped portion, the stepped portion comprising a second plurality of conductive contacts.

Example 20 includes the subject matter of Example 19, and wherein forming the package comprises forming a trench through a portion of the package and removing a portion of the package during formation of the non-stepped portion.

Example 21 includes the subject matter of any of Examples 19 and 20, and wherein the non-stepped portion comprises a first plurality of solder balls coupled to the first plurality of conductive contacts, wherein the stepped portion comprises a second plurality of solder balls coupled to the second plurality of conductive contacts.

Example 22 includes the subject matter of any of Examples 19-21, and wherein the second plurality of solder balls have a height that is larger than a height of the first plurality of solder balls.

Example 23 includes the subject matter of any of Examples 19-22, the second side further comprising a second stepped portion that protrudes from the stepped portion, the second stepped portion comprising a third plurality of conductive contacts.

Example 24 includes the subject matter of any of Examples 19-23, and wherein the second stepped portion is to interface with a second package through an aperture of the circuit board.

Example 25 includes the subject matter of any of Examples 19-24, and wherein the first plurality of conductive contacts and the second plurality of conductive contacts are arranged in a grid array.

Example 26 includes the subject matter of any of Examples 19-25, and further including coupling a chip to the first side of the package.

Example 27 includes the subject matter of any of Examples 19-26, and wherein the non-stepped portion surrounds the stepped portion.

Example 28 includes the subject matter of any of Examples 19-27, and further including coupling the package to the circuit board, the circuit board comprising a non-recessed portion to interface with the non-stepped portion of the second side of the package; and a recessed portion to interface with the stepped portion of the second side of the package.

Example 29 includes the subject matter of any of Examples 19-28, and wherein the circuit board comprises an aperture within the recessed portion, and the method further comprises coupling a second package to the package through the aperture.

Example 30 includes the subject matter of any of Examples 19-29, and wherein the second package comprises a side with a non-stepped portion and a stepped portion, wherein the stepped portion of the second package is coupled to the package through the aperture.

Example 31 includes the subject matter of any of Examples 19-30, and wherein the package comprises a chip comprising a processor.

Example 32 includes the subject matter of any of Examples 19-31, and further including communicatively coupling a battery, a display, or a network interface to the processor.

Example 33 includes a method comprising forming a circuit board, the circuit board comprising a plurality of conductive layers comprising a top conductive layer, a bottom conductive layer, and a plurality of internal conductive layers between the top conductive layer and the bottom conductive layer; and a first side comprising a non-recessed portion and a recessed portion, wherein the non-recessed portion comprises a plurality of conductive contacts to the top conductive layer, wherein the recessed portion comprises a second plurality of conductive contacts to an internal conductive layer of the plurality of conductive layers.

Example 34 includes the subject matter of Example 33, the first side comprising a second recessed portion, the second recessed portion recessed within at least a portion of the recessed portion, wherein the second recessed portion comprises a third plurality of conductive contacts to a second internal conductive layer of the plurality of conductive layers.

Example 35 includes the subject matter of any of Examples 33-34, the first side comprising a second recessed portion comprising a third plurality of conductive contacts to an internal conductive layer of the plurality of conductive layers, wherein the recessed portion is to interface with a portion of a package comprising a central processing unit, wherein the second recessed portion is to interface with a second package.

Example 36 includes the subject matter of any of Examples 33-35, and further including forming an aperture within the recessed portion.

Example 37 includes the subject matter of any of Examples 33-36, the circuit board comprising a second side opposite the first side, the second side comprising a second non-recessed portion and a second recessed portion, wherein the second non-recessed portion comprises a third plurality of conductive contacts to the bottom conductive layer, wherein the second recessed portion comprises a fourth plurality of conductive contacts to a second internal conductive layer of the plurality of internal conductive layers.

What is claimed is:

1. An apparatus comprising:
a package comprising:
a first side to interface with at least one chip; and
a second side to interface with a circuit board, the second side opposite to the first side, wherein the second side comprises:
a non-stepped portion comprising a first plurality of conductive contacts; and
a stepped portion that protrudes from the non-stepped portion, the stepped portion comprising a second plurality of conductive contacts;
wherein the package is to interface with a circuit board, wherein the circuit board comprises a non-recessed portion to interface with the non-stepped portion of the second side of the package; and a recessed portion to interface with the stepped portion of the second side of the package, wherein the circuit board comprises an electronic component on the non-recessed portion, wherein the electronic component is coupled to a plated through hole via, wherein the plated through hole via is to electrically conductively couple to a solder ball on the stepped portion of the package.

2. The apparatus of claim 1, wherein the non-stepped portion comprises a first plurality of solder balls coupled to the first plurality of conductive contacts, wherein the stepped portion comprises a second plurality of solder balls coupled to the second plurality of conductive contacts.

3. The apparatus of claim 2, wherein the second plurality of solder balls have a height that is larger than a height of the first plurality of solder balls.

4. The apparatus of claim 1, the second side further comprising a second stepped portion that protrudes from the stepped portion, the second stepped portion comprising a third plurality of conductive contacts.

5. The apparatus of claim 4, wherein the second stepped portion is to interface with a second package through an aperture of the circuit board.

6. The apparatus of claim 1, wherein the first plurality of conductive contacts and the second plurality of conductive contacts are arranged in a grid array.

7. The apparatus of claim 1, wherein the package comprises a chip coupled to the first side of the package.

8. The apparatus of claim 1, wherein the non-stepped portion surrounds the stepped portion.

9. The apparatus of claim 1, further comprising the circuit board, the circuit board comprising:
a non-recessed portion to interface with the non-stepped portion of the second side of the package; and
a recessed portion to interface with the stepped portion of the second side of the package.

10. The apparatus of claim 9, wherein the circuit board comprises an aperture within the recessed portion, wherein the apparatus comprises a second package coupled to the package through the aperture.

11. The apparatus of claim 10, wherein the second package comprises a side with a non-stepped portion and a stepped portion, wherein the stepped portion of the second package is coupled to the package through the aperture.

12. The apparatus of claim 1, wherein the package comprises a chip comprising a processor.

13. The apparatus of claim 12, further comprising a battery communicatively coupled to the processor, a display communicatively coupled to the processor, or a network interface communicatively coupled to the processor.

14. The apparatus of claim 1, wherein the electronic component comprises a voltage regulator, wherein a power signal of the voltage regulator is to electrically conductively couple to the at least one chip through an interconnect of a conductive layer of the circuit board and a solder ball on the stepped portion of the package.

15. An apparatus comprising: a circuit board to interface with a package, the package comprising: a first side to interface with at least one chip; and a second side to interface with the circuit board, the second side opposite to the first side, wherein the second side comprises: a non-stepped portion comprising a first plurality of conductive contacts; and a stepped portion that protrudes from the non-stepped portion, the stepped portion comprising a second plurality of conductive contacts; wherein the circuit board comprises a non-recessed portion to interface with the non-stepped portion of the second side of the package; and a recessed portion to interface with the stepped portion of the second side of the package, wherein the circuit board comprises an electronic component on the non-recessed portion, wherein the electronic component is coupled to a plated through hole via, wherein the plated through hole via is to electrically conductively couple to a solder ball on the stepped portion of the package.

16. A method comprising forming a package, wherein the package comprises:

a first side to interface with at least one chip; and a second side to interface with a circuit board, the second side opposite to the first side, wherein the second side comprises:

a non-stepped portion comprising a first plurality of conductive contacts; and a stepped portion that protrudes from the non-stepped portion, the stepped portion comprising a second plurality of conductive contacts;

wherein the package is to interface with a circuit board, wherein the circuit board comprises a non-recessed portion to interface with the non-stepped portion of the second side of the package; and a recessed portion to interface with the stepped portion of the second side of the package, wherein the circuit board comprises an electronic component on the non-recessed portion, wherein the electronic component is coupled to a plated through hole via, wherein the plated through hole via is to electrically conductively couple to a solder ball on the stepped portion of the package.

* * * * *